US012665563B2

(12) United States Patent
Kim et al.

(10) Patent No.: US 12,665,563 B2
(45) Date of Patent: Jun. 23, 2026

(54) SIGNAL POWER SPLITTER/COMBINER WITH RESISTANCE AND IMPEDANCE TRANSFORMER LOADING

(71) Applicant: QUALCOMM Incorporated, San Diego, CA (US)

(72) Inventors: Jonghae Kim, San Diego, CA (US); Sang-June Park, San Diego, CA (US); Periannan Chidambaram, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 522 days.

(21) Appl. No.: 17/392,005

(22) Filed: Aug. 2, 2021

(65) Prior Publication Data

US 2023/0030569 A1     Feb. 2, 2023

(51) Int. Cl.
| | |
|---|---|
| *H03H 7/38* | (2006.01) |
| *H01P 5/12* | (2006.01) |
| *H04B 1/38* | (2015.01) |

(52) U.S. Cl.
CPC ................. *H03H 7/38* (2013.01); *H01P 5/12* (2013.01); *H04B 1/38* (2013.01)

(58) Field of Classification Search
CPC ............... H03H 7/38; H01P 5/12; H04B 1/38
See application file for complete search history.

(56) References Cited

U.S. PATENT DOCUMENTS

| | | | | |
|---|---|---|---|---|
| 5,206,611 A | * | 4/1993 | Russell | ..................... H01P 5/12 |
| | | | | 333/127 |
| 5,469,129 A | | 11/1995 | Dydyk | |
| 7,616,058 B1 | * | 11/2009 | Nezakati | ................ H03F 3/602 |
| | | | | 333/33 |
| 7,936,212 B2 | | 5/2011 | Pengelly | |

(Continued)

FOREIGN PATENT DOCUMENTS

| | | | | |
|---|---|---|---|---|
| CN | 102027515 A | * | 4/2011 | ............. B31D 1/025 |
| EP | 0210606 A2 | | 2/1987 | |

(Continued)

OTHER PUBLICATIONS

Taiwan Search Report—TW111126629—TIPO—Dec. 30, 2025.

(Continued)

*Primary Examiner* — Raymond S Dean
(74) *Attorney, Agent, or Firm* — Loza & Loza, LLP

(57)     ABSTRACT

An aspect relates to a signal power splitter/combiner including a first signal port; a first resistor; a first impedance transformer coupled in series with the first resistor between the first signal port and a first intermediate node; a second impedance transformer coupled between the first intermediate node and a second signal port; a third impedance transformer coupled between the first intermediate node and a third signal port; and a second resistor coupled between the second and third signal ports. The signal power splitter/combiner may further include a fourth impedance transformer coupled between the second impedance transformer and the second signal port, a fifth impedance transformer (Continued)

coupled between the third impedance transformer and the third signal port; and a third resistor coupled between a third intermediate nod.

24 Claims, 10 Drawing Sheets

(56) References Cited

U.S. PATENT DOCUMENTS

| | | | | |
|---|---|---|---|---|
| 8,723,618 | B2 | 5/2014 | Hirota et al. | |
| 8,779,826 | B1 | 7/2014 | Chang et al. | |
| 9,948,384 | B1 * | 4/2018 | Morara | H04L 41/16 |
| 10,903,178 | B1 | 1/2021 | Campbell | |
| 2003/0179055 | A1 * | 9/2003 | Sweeney | H05K 1/0243 |
| | | | | 333/260 |
| 2004/0108921 | A1 * | 6/2004 | Sacco | H01P 3/121 |
| | | | | 333/239 |
| 2010/0039187 | A1 | 2/2010 | Yurugi et al. | |
| 2010/0225417 | A1 * | 9/2010 | Mistretta | H01P 5/16 |
| | | | | 216/13 |
| 2010/0244981 | A1 | 9/2010 | Gorbachov | |
| 2012/0064689 | A1 * | 3/2012 | Hirota | H10D 1/692 |
| | | | | 438/381 |
| 2017/0012041 | A1 * | 1/2017 | Chong | H01L 23/5228 |
| 2019/0214700 | A1 | 7/2019 | Wang et al. | |
| 2021/0063514 | A1 | 3/2021 | Liu et al. | |

FOREIGN PATENT DOCUMENTS

| | | | | | |
|---|---|---|---|---|---|
| JP | H10233637 | A | 9/1998 | | |
| JP | 2002259481 | A | 9/2002 | | |
| JP | 2003163514 | A | 6/2003 | | |
| JP | 2004336321 | A | 11/2004 | | |
| JP | 2006135447 | A | 5/2006 | | |
| JP | 2010251904 | A | 11/2010 | | |
| JP | 2019047205 | A | 3/2019 | | |
| WO | WO-2010071248 | A1 * | 6/2010 | .......... | H03F 1/0294 |

OTHER PUBLICATIONS

Bahl I.J., "Ultrabroadband and Compact Power Dividers/Combiners on Gallium Arsenide Substrate" , IEEE Microwave Magazine, vol. 9, No. 2, Apr. 2008, XP011225693, pp. 96-104, section "The Wilkinson Power Divider" bridging pp. 98, 99, figures 3-5.

International Search Report and Written Opinion—PCT/US2022/037358—ISA/EPO—Nov. 8, 2022.

Kim J., et al., "A Switchless, Q-Band Bidirectional Transceiver in 0.12-μm SiGe BiCMOS Technology", IEEE Journal of Solid-State Circuits, vol. 47, No. 2, Feb. 2012, XP011393182, pp. 368-380, figure 1.

Sledkov V.A., et al., "Analysis and Optimization of Multichannel In-Phase Binary Microwave Power Dividers", Soviet Journal of Communications Technology and Electronics, Scripta Technica, vol. 31, No. 5, May 1986, XP001368522, pp. 181-184, figure 1.

Torgersen Tron: "Wilkinson Power Divider—A Miniaturized MMIC Lumped Component Equivalent", Jun. 2009, XP055974394, pp. 1-146, pp. 5-8, figures 2,4,5.

* cited by examiner

300

400

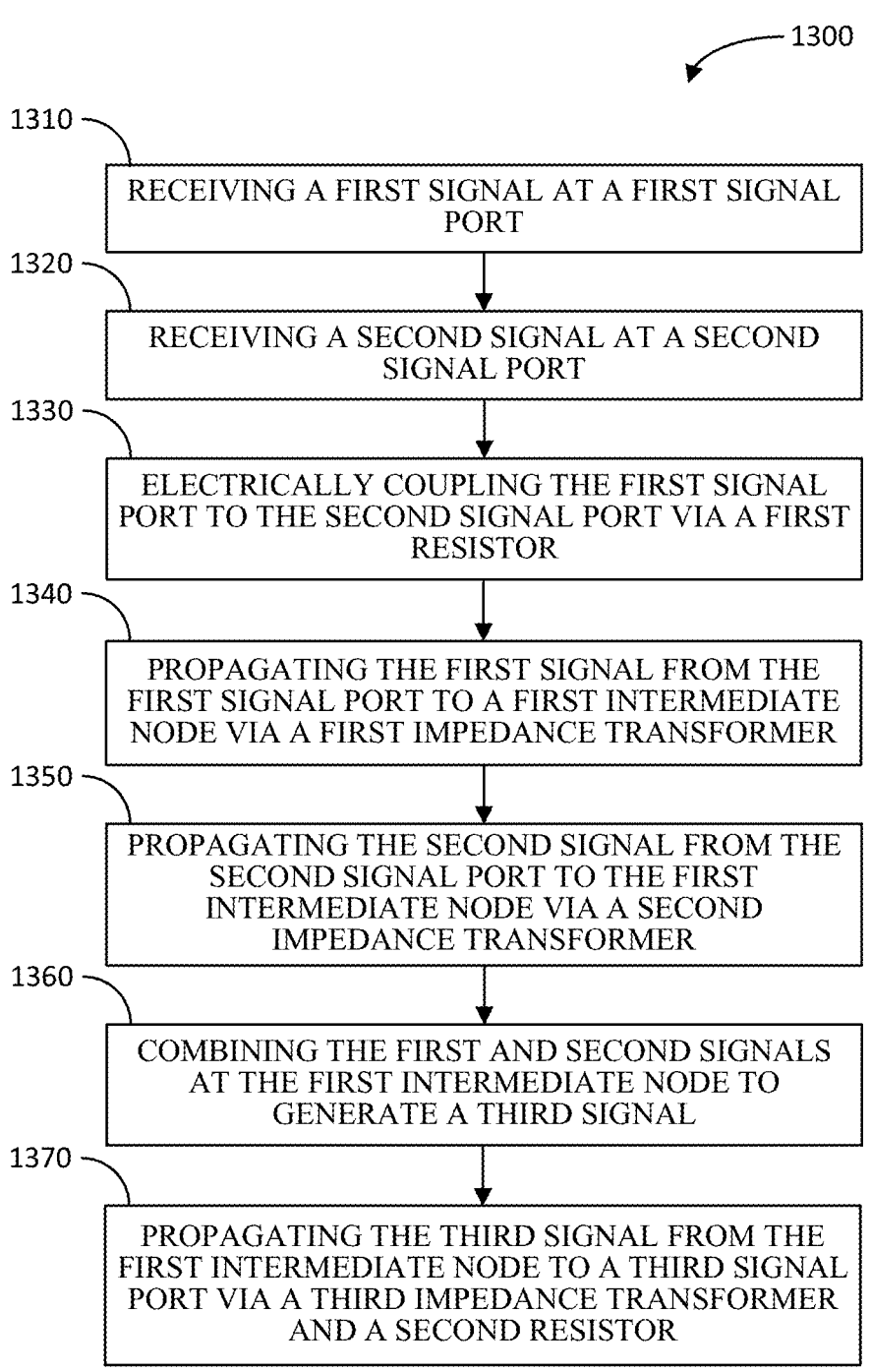

1300

1310 — RECEIVING A FIRST SIGNAL AT A FIRST SIGNAL PORT

1320 — RECEIVING A SECOND SIGNAL AT A SECOND SIGNAL PORT

1330 — ELECTRICALLY COUPLING THE FIRST SIGNAL PORT TO THE SECOND SIGNAL PORT VIA A FIRST RESISTOR

1340 — PROPAGATING THE FIRST SIGNAL FROM THE FIRST SIGNAL PORT TO A FIRST INTERMEDIATE NODE VIA A FIRST IMPEDANCE TRANSFORMER

1350 — PROPAGATING THE SECOND SIGNAL FROM THE SECOND SIGNAL PORT TO THE FIRST INTERMEDIATE NODE VIA A SECOND IMPEDANCE TRANSFORMER

1360 — COMBINING THE FIRST AND SECOND SIGNALS AT THE FIRST INTERMEDIATE NODE TO GENERATE A THIRD SIGNAL

1370 — PROPAGATING THE THIRD SIGNAL FROM THE FIRST INTERMEDIATE NODE TO A THIRD SIGNAL PORT VIA A THIRD IMPEDANCE TRANSFORMER AND A SECOND RESISTOR

SIGNAL POWER SPLITTER/COMBINER WITH RESISTANCE AND IMPEDANCE TRANSFORMER LOADING

FIELD

Aspects of the present disclosure relate generally to signal power splitters/combiners, and in particular, to a signal power splitter/combiner with resistance and impedance transformer loading for improved performance over a wider bandwidth.

BACKGROUND

A signal power splitter is configured to receive an input signal, and power split the input signal to generate a set of output signals. Conversely, a signal power combiner is configured to receive a set of input signals, and power combiner the input signals to generate an output signal. Generally, a signal power splitter or combiner has reciprocity property, where the same device may be used as a power splitter or combiner depending on if the input signal is received at a single port on one side of the device, or a set of input signals are received at a set of input ports on another side of the device.

Other properties of interests of signal power splitters/combiners include insertion loss between an input port and an output port, isolation between two or more input or output ports, and impedance matching or return loss at any of the ports.

SUMMARY

The following presents a simplified summary of one or more implementations in order to provide a basic understanding of such implementations. This summary is not an extensive overview of all contemplated implementations, and is intended to neither identify key or critical elements of all implementations nor delineate the scope of any or all implementations. Its sole purpose is to present some concepts of one or more implementations in a simplified form as a prelude to the more detailed description that is presented later.

An aspect of the disclosure relates to an apparatus. The apparatus includes a first signal port; a first resistor; a first impedance transformer coupled in series with the first resistor between the first signal port and a first intermediate node; a second impedance transformer coupled between the first intermediate node and a second signal port; a third impedance transformer coupled between the first intermediate node and a third signal port; and a second resistor coupled between the second and third signal ports.

Another aspect of the disclosure relates to a method. The method includes receiving a first signal at a first signal port; propagating the first signal through a first resistor and a first transformer to generate a second signal at a first intermediate node; splitting the second signal at the first intermediate node to generate third and fourth signals; propagating the third signal through a second impedance transformer towards a second signal port; propagating the fourth signal through a third impedance transformer towards a third signal port; and electrically coupling the second signal port to the third signal port via a second resistor.

Another aspect of the disclosure relates to an apparatus. The apparatus includes means for receiving a first signal at a first signal port; means for propagating the first signal through a first resistor and a first transformer to generate a second signal at a first intermediate node; means for splitting the second signal at the first intermediate node to generate third and fourth signals; means for propagating the third signal through a second impedance transformer towards a second signal port; means for propagating the fourth signal through a third impedance transformer towards a third signal port; and means for electrically coupling the second signal port to the third signal port via a second resistor.

Another aspect of the disclosure relates to a method. The method includes receiving a first signal at a first signal port; receiving a second signal at a second signal port; electrically coupling the first signal port to the second signal port via a first resistor; propagating the first signal from the first signal port to a first intermediate node via a first impedance transformer; propagating the second signal from the second signal port to the first intermediate node via a second impedance transformer; combining the first and second signals at the first intermediate node to generate a third signal; and propagating the third signal from the first intermediate node to a third signal port via a third impedance transformer and a second resistor.

Another aspect of the disclosure relates to an apparatus. The apparatus includes means for receiving a first signal at a first signal port; means for receiving a second signal at a second signal port; means for electrically coupling the first signal port to the second signal port via a first resistor; means for propagating the first signal from the first signal port to a first intermediate node via a first impedance transformer; means for propagating the second signal from the second signal port to the first intermediate node via a second impedance transformer; means for combining the first and second signals at the first intermediate node to generate a third signal; and means for propagating the third signal from the first intermediate node to a third signal port via a third impedance transformer and a second resistor.

Another aspect of the disclosure relates to a wireless communication device. The wireless communication device includes at least one antenna; a set of transceiver chains coupled to the at least one antenna; and a signal power splitter or combiner coupled to the set of transceiver chains, wherein the signal power splitter or combiner includes: a first signal port; a first resistor; a first impedance transformer coupled in series with the first resistor between the first signal port and a first intermediate node; a second impedance transformer coupled between the first intermediate node and a second signal port; a third impedance transformer coupled between the first intermediate node and a third signal port; and a second resistor coupled between the second and third signal ports.

To the accomplishment of the foregoing and related ends, the one or more implementations include the features hereinafter fully described and particularly pointed out in the claims. The following description and the annexed drawings set forth in detail certain illustrative aspects of the one or more implementations. These aspects are indicative, however, of but a few of the various ways in which the principles of various implementations may be employed and the description implementations are intended to include all such aspects and their equivalents.

BRIEF DESCRIPTION OF THE DRAWINGS

FIG. 13 illustrates a flow diagram of an example method of power combining signals in accordance with another aspect of the disclosure.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1A:
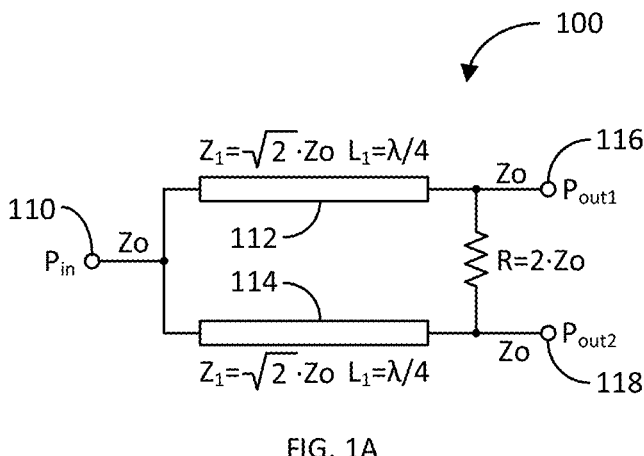
FIG. 1A illustrates a schematic diagram of an example signal power splitter in accordance with an aspect of the disclosure.

FIG. 1A illustrates a schematic diagram of an example signal power splitter 100 in accordance with an aspect of the disclosure. The signal power splitter 100 is configured to receive an input signal $P_{in}$, and power split the input signal $P_{in}$ to generate first and second output signals $P_{out1}$ and $P_{out2}$.

In this example, the power splitting is equal or balanced, i.e., meaning that the power level of the first output signal $P_{out1}$ is substantially the same as the power level of the second output signal $P_{out2}$. Assuming there is no insertion loss between the input and outputs of the signal power splitter 100, the signal power of each of the first and second output signals $P_{out1}$ and $P_{out2}$ is substantially three (3) decibels (dB) lower than the signal power of the input signal $P_{in}$.

The signal power splitter 100 includes an input signal port 110, a first transmission line 112 coupled between the input signal port 110 and a first output signal port 116, a second transmission line 114 coupled between the input signal port 110 and a second output signal port 118, and a resistor R coupled between the first and second output signal ports 116 and 118. As discussed, an input signal $P_{in}$ is received at the input signal port 110, and the first and second output signals $P_{out1}$ and $P_{out2}$ are produced at the first and second output ports 116 and 118, respectively.

If the input signal port 110 and output signal ports 116 and 118 have a particular characteristic impedance Zo at a particular wavelength λ or frequency, the transmission lines 112 and 114 each have substantially the same impedance of $Z_1$, which may be set to substantially $\sqrt{2} \cdot Zo$. Additionally, the transmission lines 112 and 114 each have substantially the same length $L_1$, which may be set to substantially a quarter wavelength (2l4) at a particular frequency. Further, the resistance of the resistor R may be set to substantially $2 \cdot Zo$.

The transmission lines 112 and 114 may be implemented as a microstrip, stripline, coplanar microstrip, suspended microstrip, or other, where the transmission lines 112 and 114 are each implemented as a metallization strips disposed on a dielectric or semiconductor substrate. The resistor R may also be implemented as suitably dimensioned thin film material, such as titanium nitride (TiN), disposed on the dielectric or semiconductor substrate.

Figure 1B:
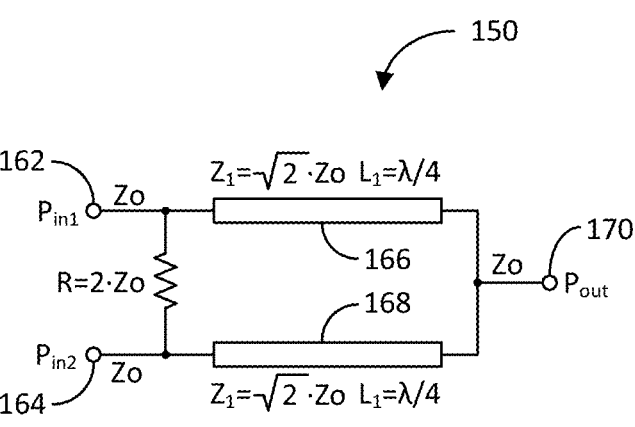
FIG. 1B illustrates a schematic diagram of an example signal power combiner in accordance with another aspect of the disclosure.

FIG. 1B illustrates a schematic diagram of an example signal power combiner 150 in accordance with another aspect of the disclosure. The signal power splitter 100 previously discussed has a reciprocity property. That is, the signal power splitter 100 may be configured as a signal power combiner by receiving respective input signals at the ports 116 and 118, and generating a combined signal at port 110. The signal power combiner 150 is an example of the signal power splitter 100 being used as a power combiner. Because of its reciprocity property, the signal power splitter 100 and combiner 150 are generally referred to herein as a signal power splitter/combiner.

The signal power combiner 150 is configured to receive first and second input signals $P_{in1}$ and $P_{in2}$, and power combine the input signals $P_{in1}$ and $P_{in2}$ to generate an output signal $P_{out}$. In this example, the power combining is equal or balanced, i.e., meaning that the power level of the output signal $P_{out}$ is substantially the sum of the power levels of the input signals $P_{in1}$ and $P_{in2}$. Assuming there is no insertion loss between the inputs and output of the signal power combiner 150, and the input signals $P_{in1}$ and $P_{in2}$ have substantially the same power, the power of the output signal $P_{out}$ is substantially 3 dB higher than the signal power of each of the input signals $P_{in1}$ and $P_{in2}$.

The signal power combiner 150 includes a first input signal port 162, a second input signal port 164, a resistor R coupled between the first and second input signal ports 162 and 164, a first transmission line 166 coupled between the first input signal port 162 and an output signal port 170, and a second transmission line 168 coupled between the second input signal port 164 and the output signal port 170. As discussed, first and second input signal $P_{in1}$ and $P_{in2}$ are received at the first and second input signal port 162 and 164, respectively, and the output signal $P_{out}$ is produced at the output signal port 170.

If the input signal ports 162 and 164 and output signal port 170 each have a particular characteristic impedance Zo at a particular wavelength λ or frequency, the transmission lines 166 and 168 each have substantially the same impedance of $Z_1$, which may be set to substantially $\sqrt{2}\cdot$Zo. Additionally, the transmission lines 166 and 168 each have substantially the same length $L_1$, which may be set to substantially quarter wavelength (λ/4) at a particular frequency. Further, the resistance of the resistor R may be set to substantially 2·Zo.

Similarly, the transmission lines 166 and 168 may be implemented as a microstrip, stripline, coplanar microstrip, suspended microstrip, or other, where the transmission lines 166 and 168 are each implemented as a metallization strip disposed on a dielectric or semiconductor substrate. The resistor R may also be implemented as a suitably dimensioned thin film material, such as titanium nitride (TiN), disposed on the dielectric or semiconductor substrate.

Figure 2A:
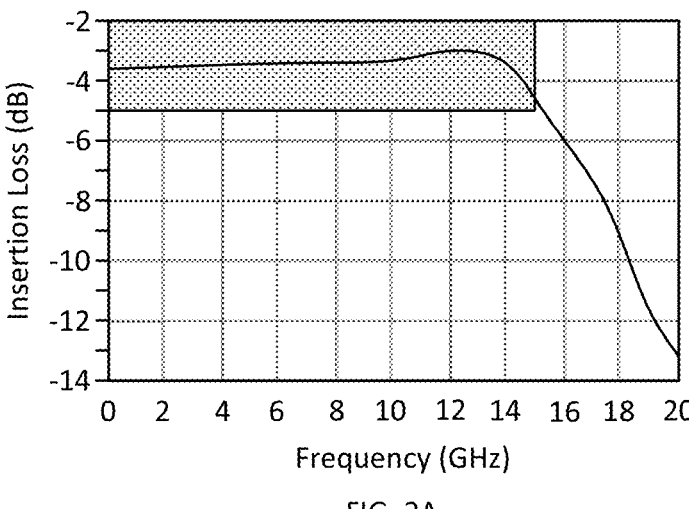
FIGS. 2A-2C illustrate graphs of example specifications and responses associated with the signal power splitter/combiner of FIG. 1A or 1B in accordance with another aspect of the disclosure.
Figure 2B:
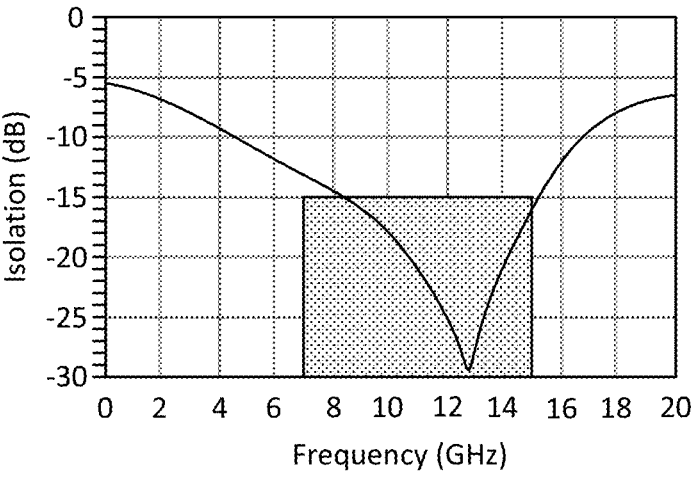
Figure 2C:
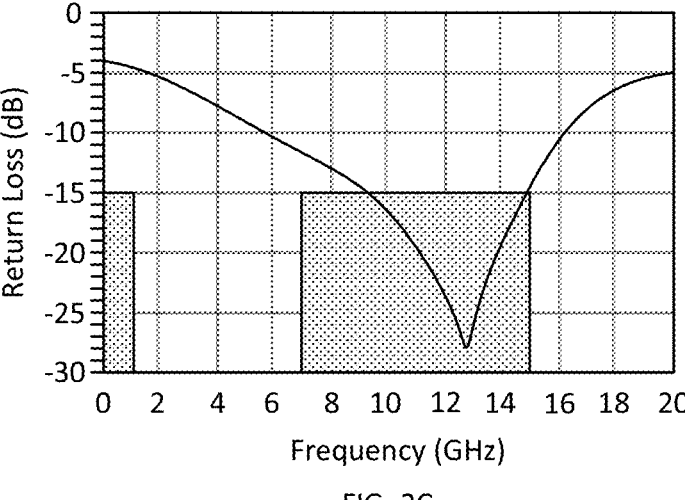

FIGS. 2A-2C illustrate graphs of example specifications and responses associated with the signal power splitter/combiner 100/150 in accordance with another aspect of the disclosure. In each of the graphs, the x- or horizontal-axis represents frequency from 0 Hertz at the left end to 20 giga Hertz (GHz) at the right end. The y- or vertical-axis of the graph depicted in FIG. 2A represents insertion loss in dB between port 110/170 and port 116/162 (or port 110/170 and port 118/164) from −2 dB at the top to −14 dB at the bottom. The y- or vertical-axis of the graph depicted in FIG. 2B represents isolation in dB between the ports 116/162 and 118/164 from 0 dB at the top to −30 dB at the bottom. The y- or vertical-axis of the graph depicted in FIG. 2C represents the return loss dB at port 110/170 from 0 dB at the top to −30 dB at the bottom.

With specific reference to FIG. 2A, the graph includes a shaded region indicating an example specification for the insertion loss for a particular application. In particular, the specification indicates an insertion loss of −5 dB or less between frequencies 0 to 15 GHz, but ideally should be −3 dB across the whole frequency band. Additionally, as discussed, the graph also shows the insertion loss in dB between port 110/170 and port 116/162 (or port 110/170 and port 118/164). Note that the insertion loss varies between −3 dB and −4 dB between frequencies 0 to 15 GHz, which meets the example specification for insertion loss.

With specific reference to FIG. 2B, the graph includes a shaded region indicating an example specification for the isolation between ports 116/162 and 118/164 for a particular application. In particular, the specification indicates an isolation of −15 dB or more between frequencies 7 to 15 GHz. Additionally, as discussed, the graph also shows the isolation between ports 116/162 and 118/164. Note that the isolation varies between −13 dB and −29 dB within frequency band 7 to 15 GHz. Thus, in the lower part of the frequency band 7 to 15 GHz (e.g., between 7-8 GHz), the isolation between ports 116/162 and 118/164 fails to meet the specification. This is because the length $L_1$ of the transmission lines 112/166 and 114/168 are each set for a particular frequency such as, in this example, 13 GHz, where the isolation peaks at −29 dB. The isolation decreases for frequencies farther away from the particular frequency where, in this example, the isolation does not meet specification below 8.2 GHz.

With specific reference to FIG. 2C, the graph includes shaded regions indicating an example specification for the return loss at port 110/170 for a particular application. In particular, the specification indicates a return loss of −15 dB or less within a lower frequency band 0 to 1 GHz and within a higher frequency band 7-15 GHz. Additionally, as discussed, the graph also shows the return loss at such port 110/170. Note that the return loss varies between −12 dB and −27 dB within the higher frequency band 7 to 15 GHz. Thus, especially in the lower part of the higher frequency band 7 to 15 GHz (e.g., between 7-9 GHz), the return loss fails to meet specification. Additionally, for the entire lower frequency band 0 to 1 GHz, the return loss is greater than −5 dB, which significantly fails to meet specification. Again, this is because the length $L_1$ of the transmission lines 112/166 and 114/168 are each set for a particular frequency such as, in this example, 13 GHz, where the return loss is best at −29 dB. The return loss increases for frequencies farther away from the particular frequency where, in this example, the return loss does not meet specification below 9 GHz for the higher frequency band, and does not meet specification for the entire lower frequency band.

Figure 3:
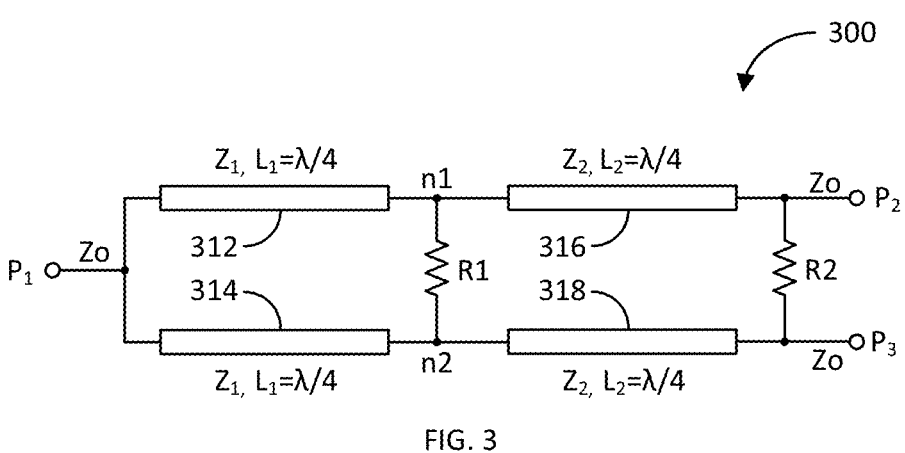
FIG. 3 illustrates a schematic diagram of another example signal power splitter/combiner in accordance with another aspect of the disclosure.

FIG. 3 illustrates a schematic diagram of another example signal power splitter/combiner 300 in accordance with another aspect of the disclosure. An approach to improve the bandwidth over which a signal power splitter/combiner may be able to meet specification in terms of insertion loss, isolation, and return loss is to add more stages to the signal power splitter/combiner. The power splitter/combiner 300 is an example of a multi-stage signal power splitter/combiner.

In particular, the signal power splitter/combiner 300 includes a first signal port $P_1$, a first transmission line 312 coupled between the first signal port $P_1$ and a first intermediate node n1, a second transmission line 314 coupled between the first signal port $P_1$ and a second intermediate node n2, and a first resistor R1 coupled between the first and second intermediate nodes n1 and n2. The signal power splitter/combiner 300 further includes a third transmission line 316 coupled between the first intermediate node n1 and a second signal port $P_2$, a fourth transmission line 318 coupled between the second intermediate node n2 and a third signal port $P_3$, and a second resistor R2 coupled between the second and third signal ports $P_2$ and $P_3$.

If the signal power splitter/combiner 300 is used as a power splitter, the signal power splitter/combiner 300 receives an input signal $P_{in}$ at port $P_1$, and generates output signals $P_{out1}$ and $P_{out2}$ at ports $P_2$ and $P_3$, respectively. If the signal power splitter/combiner 300 is used as a power combiner, the signal power splitter/combiner 300 receives input signals $P_{in1}$ and $P_{in2}$ at ports $P_2$ and $P_3$, respectively, and generates an output signal $P_{out}$ at port $P_1$.

If the ports $P_1$, $P_2$, and $P_3$ each has a characteristic impedance Zo at a particular wavelength λ or frequency, the first and second transmission lines 312 and 314 may each have substantially the same impedance $Z_1$ (e.g., $Z_1$=1.32·Zo) and substantially the same length $L_1$ (e.g., λ/4 at a particular frequency (e.g., 13 GHz)). Further, the resistance of the first resistor R1 may be set to substantially 1.87·Zo. Additionally, the third and fourth transmission lines 316 and 318 may each have substantially the same impedance of $Z_2$ (e.g., $Z_2$=1.13·Zo) and substantially the same length $L_2$ (e.g., λ/4 at the particular frequency (e.g., 13 GHz)). Further, the resistance of the second resistor R2 may be set to substantially 3.11·Zo.

The transmission lines 312, 314, 316, and 318 may be implemented as a microstrip, stripline, coplanar microstrip, suspended microstrip, or other, where the transmission lines 312, 314, 316, and 318 are each implemented as a metallization strip disposed on a dielectric or semiconductor substrate. The resistors R1 and R2 may also be implemented as suitably dimensioned thin film material, such as titanium nitride (TiN), disposed on the dielectric or semiconductor substrate.

Figure 4:
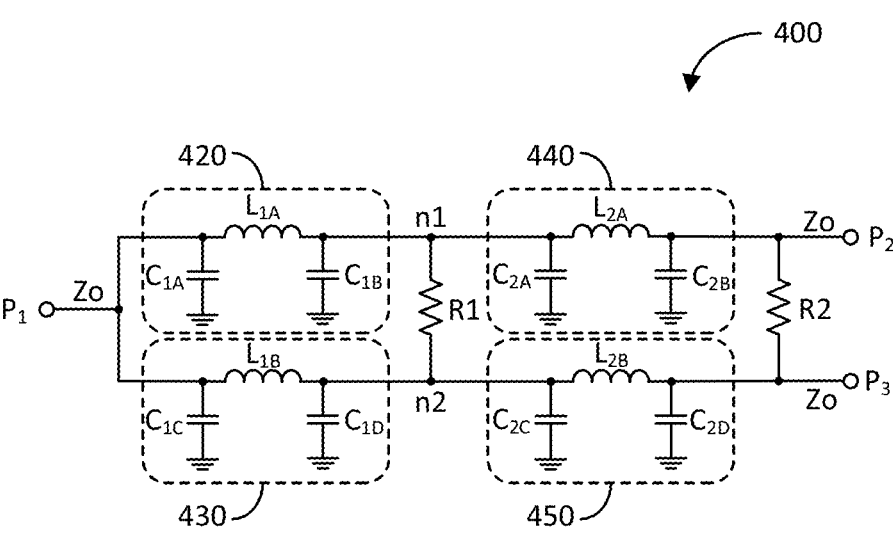
FIG. 4 illustrates a schematic diagram of another example signal power splitter/combiner in accordance with another aspect of the disclosure.

FIG. 4 illustrates a schematic diagram of another example signal power splitter/combiner 400 in accordance with another aspect of the disclosure. The signal power splitter/combiner 400 may be an alternative implementation of signal power splitter/combiner 300 previously discussed. That is, the transmission lines 312, 314, 316, and 318 of signal power splitter/combiner 300 each operate as an impedance transformer. However, another circuit to implement an equivalent impedance transformer uses discrete devices, such as a pi-network including shunt capacitors coupled to opposite ends of a series inductor, respectively. By using discrete components instead of transmission lines, the signal power splitter/combiner 400 may be made smaller or more compact compared to signal power splitter/combiner 300.

The signal power splitter/combiner 400 includes a first signal port $P_1$, a first impedance transformer 420, a second impedance transformer 430, a first resistor R1, a third impedance transformer 440, a fourth impedance transformer 450, a second resistor R2, a second signal port $P_2$, and a third signal port $P_3$. The first impedance transformer 420 is coupled between the first signal port $P_1$ and a first intermediate node n1. The first impedance transformer 420 includes a first shunt capacitor $C_{1A}$ coupled between the first signal port $P_1$ and a lower voltage rail (e.g., ground), a series inductor $L_{1A}$ coupled between the first signal port $P_1$ and the first intermediate node n1, and a second shunt capacitor $C_{1B}$ coupled between the first intermediate node n1 and the lower voltage rail (e.g., ground).

The second impedance transformer 430 is coupled between the first signal port $P_1$ and a second intermediate node n2. The second impedance transformer 430 includes a first shunt capacitor $C_{1C}$ coupled between the first signal port $P_1$ and the lower voltage rail (e.g., ground), a series inductor $L_{1B}$ coupled between the first signal port $P_1$ and the second intermediate node n2, and a second shunt capacitor Cm coupled between the second intermediate node n2 and the lower voltage rail (e.g., ground). The first resistor R1 is coupled between the first and second intermediate nodes n1 and n2.

The third impedance transformer 440 is coupled between the first intermediate node n1 and the second signal port $P_2$. The third impedance transformer 440 includes a first shunt capacitor $C_{2A}$ coupled between the first intermediate node n1 and the lower voltage rail (e.g., ground), a series inductor $L_{2A}$ coupled between the first intermediate node n1 and the second signal port $P_2$, and a second shunt capacitor $C_{2B}$ coupled between the second signal port $P_2$ and the lower voltage rail (e.g., ground).

The fourth impedance transformer 450 is coupled between the second intermediate node n2 and the third signal port $P_3$. The fourth impedance transformer 450 includes a first shunt capacitor $C_{2C}$ coupled between the second intermediate node n2 and the lower voltage rail (e.g., ground), a series inductor $L_{2B}$ coupled between the second intermediate node n2 and the third signal port $P_3$, and a second shunt capacitor $C_{2D}$ coupled between the third signal port $P_3$ and the lower voltage rail (e.g., ground).

If the signal power splitter/combiner 400 is used as a power splitter, the signal power splitter/combiner 400 receives an input signal $P_{in}$ at port $P_1$, and generates output signals $P_{out1}$ and $P_{out2}$ at ports $P_2$ and $P_3$, respectively. If the signal power splitter/combiner 400 is used as a power combiner, the signal power splitter/combiner 400 receives input signals $P_{in1}$ and $P_{in2}$ at ports $P_2$ and $P_3$, respectively, and generates an output signal $P_{out}$ at port $P_1$.

If the ports $P_1$, $P_2$, and $P_3$ each have a characteristic impedance Zo at a particular wavelength λ or frequency, the first and second impedance transformers 420 and 430 may be configured to perform substantially the same impedance transformation as the first and second transmission lines 312 and 314, respectively. This may be accomplished by setting the capacitance and inductance of capacitors $C_{1A}$, $C_{1B}$, $C_{1C}$, and $C_{1D}$ and inductors $L_{1A}$ and $L_{1B}$, respectively. For example, the capacitance of the capacitors $C_{1A}$, $C_{1B}$, $C_{1C}$, and $C_{1D}$ may be substantially the same, and the inductance of the inductors $L_{1A}$ and $L_{1B}$ may be substantially the same.

Similarly, the third and fourth impedance transformers 440 and 450 may be configured to perform substantially the same impedance transformation as the third and fourth transmission lines 316 and 318, respectively. This may be accomplished by setting the capacitance and inductance of capacitors $C_{2A}$, $C_{2B}$, $C_{2C}$, and $C_{2D}$ and inductors $L_{2A}$ and $L_{2B}$, respectively. For example, the capacitance of the capacitors $C_{2A}$, $C_{2B}$, $C_{2C}$, and $C_{2D}$ may be substantially the same, and the inductance of the inductors $L_{2A}$ and $L_{2B}$ may be substantially the same.

The resistors R1 and R2 of signal power splitter/combiner 400 may be implemented to have substantially the same resistances as resistors R1 and R2 of power splitter/combiner 300, respectively.

Figure 5A:
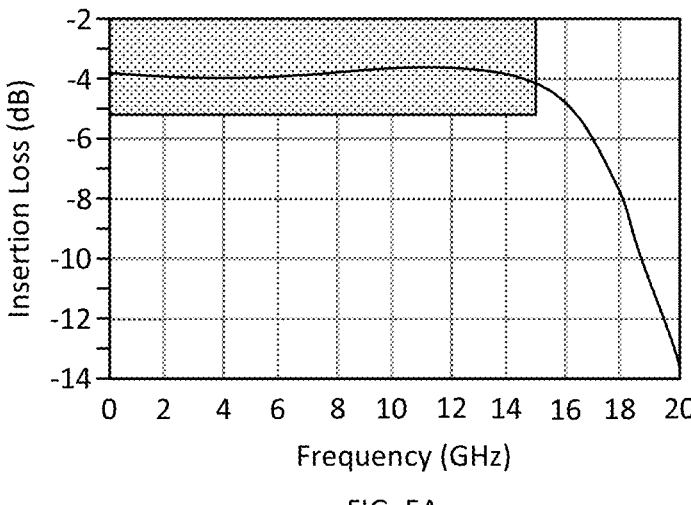
FIGS. 5A-5C illustrate graphs of example specifications and responses associated with the signal power splitter/combiner of FIG. 3 or 4 in accordance with another aspect of the disclosure.
Figure 5B:
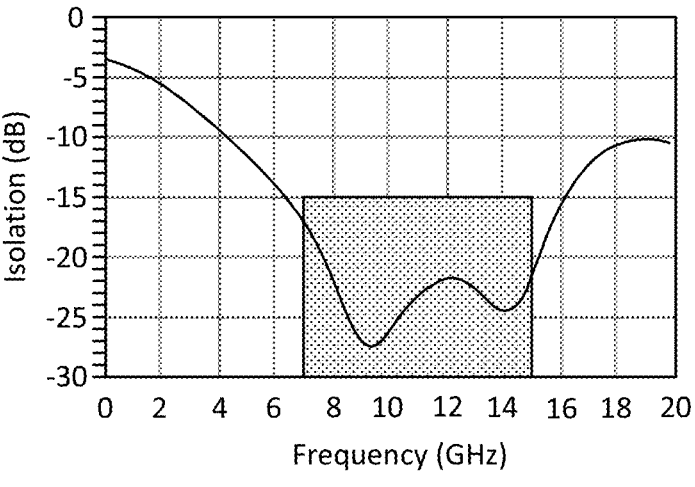
Figure 5C:
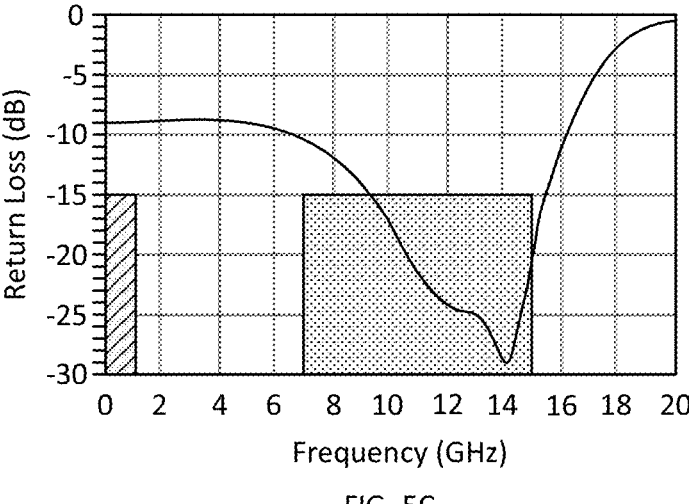

FIGS. 5A-5C illustrate graphs of example specifications and responses associated with the signal power splitter/combiner 300 or 400 in accordance with another aspect of the disclosure. The dimensions, units, and scales of the graphs are the same as those depicted in FIGS. 2A-2C, previously discussed. The graphs also depict the same specification shaded regions for the insertion loss, isolation, and return loss, respectively.

With regard to insertion loss as depicted in FIG. 5A, the graph shows that the insertion loss in dB between port $P_1$ and port $P_2$ (or $P_1$ and $P_3$) is still within −3 dB and −4 dB between frequencies 0 to 15 GHz, which meets the example specification for insertion loss. However, due to the power splitter/combiner 300 or 400 having two-stages compared to one-stage in power splitter/combiner 100 or 150, the power splitter/combiner 300 or 400 has a roll-off at a higher frequency compared to the roll-off associated with power splitter/combiner 100 or 150. For example, in the one-stage power splitter/combiner 100 or 150, the roll-off begins around 14 GHz, whereas in the two-stage power splitter/combiner 300 or 400, the roll-off begins at 15 GHz.

With regard to isolation as depicted in FIG. 5B, the graph shows the isolation between ports $P_2$ and $P_3$ is greater than −17 dB between frequencies 7 to 15 GHz, which meets the specification. Thus, due to the two-stages of power splitter/combiner 300 or 400, the bandwidth or frequency range for which the isolation meets specification is widened because the two-stages introduce another isolation peak within the frequency range of interest (e.g., 7-15 GHz). For example, the isolation has peaks at 9.5 GHz and 14 GHz.

With regard to return loss as depicted in FIG. 5C, the graph shows that the return loss is wider within the upper frequency range of interest (7-15 GHz). However, even within this frequency band, the return loss does not meet specification for frequencies between 7-9.5 GHz. With regard to the lower frequency range of interest (e.g., 0-1 GHz), the return loss does not meet specification. Thus, a two-stage signal power splitter/combiner 300 or 400 may be able to improve the return loss within the upper frequency band by frequency widening the return loss therein. However, the signal power splitter/combiner 300 or 400 still falls short of meeting specification for a portion of the upper frequency band and the entire lower frequency band.

Figure 6:
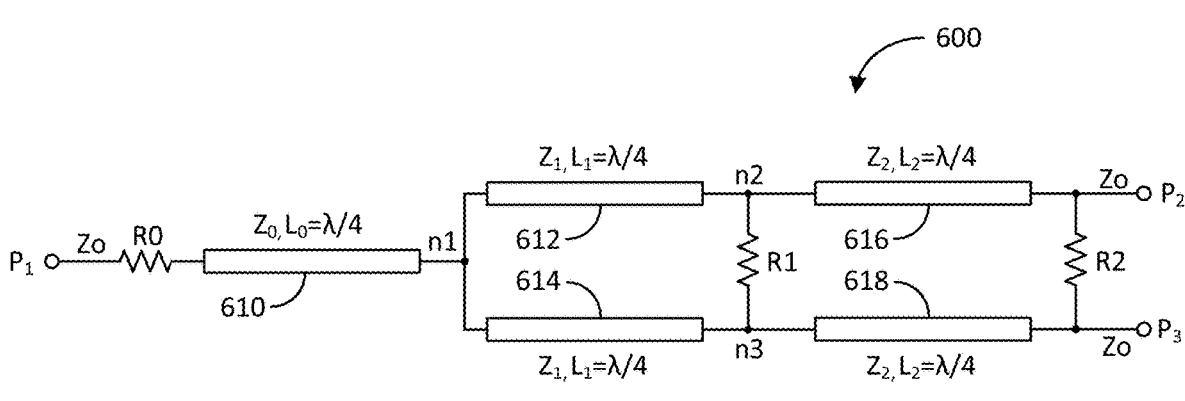
FIG. 6 illustrates a schematic diagram of another example signal power splitter/combiner in accordance with another aspect of the disclosure.

FIG. 6 illustrates a schematic diagram of another example signal power splitter/combiner 600 in accordance with another aspect of the disclosure. In summary, to improve the return loss specification within the lower frequency band (e.g., 0-1 GHz) and the lower portion of the upper frequency band (e.g., 7-15 GHz), the signal power splitter/combiner 600 includes a loading resistor R0 and an additional impedance transformer 610 coupled in series between a signal port $P_1$ and first and second impedance transformers 612 and 614. As discussed in more detail herein, the loading resistor R0 improves the return loss within the lower frequency band so that it meets specification within that frequency band. The additional impedance transformer 610 improves the return loss within the lower portion of the upper frequency band so that the return loss across the upper frequency band meets specification.

In particular, the signal power splitter/combiner 600 includes a first signal port $P_1$, a loading resistor R0, a series transmission line 610, first and second parallel transmission lines 612 and 614, a first resistor R1, third and fourth parallel transmission lines 616 and 618, a second resistor R2, and second and third signal ports $P_2$ and $P_3$. The loading resistor R0 and the series transmission line 610 are coupled in series between the first signal port $P_1$ and a first intermediate node n1. The first parallel transmission line 612 is coupled between the first intermediate node n1 and a second intermediate node n2. The second parallel transmission line 614 is coupled between the first intermediate node n1 and a third intermediate node n3. The first resistor R1 is coupled between the second and third intermediate nodes n2 and n3. The third parallel transmission line 616 is coupled between the second intermediate node n2 and the second signal port $P_2$. The fourth parallel transmission line 618 is coupled between the third intermediate node n3 and the third signal port $P_3$. The second resistor R2 is coupled between the second and third signal ports $P_2$ and $P_3$.

Similarly, if the signal power splitter/combiner 600 is used as a power splitter, the signal power splitter/combiner 600 receives an input signal $P_{in}$ at port $P_1$, and generates output signals $P_{out1}$ and $P_{out2}$ at ports $P_2$ and $P_3$, respectively. If the signal power splitter/combiner 600 is used as a power combiner, the signal power splitter/combiner 600 receives input signals $P_{in1}$ and $P_{in2}$ at ports $P_2$ and $P_3$, respectively, and generates an output signal $P_{out}$ at port $P_1$. The resistances of the resistors R0, R1, and R2, the impedances $Z_0$, $Z_1$, and $Z_2$ and lengths $L_1$, $L_2$, and $L_3$ of the transmission lines 610, 612/614, and 616/618 may be optimized so that the insertion loss, isolation, and return loss across one or more frequency bands of interests meet specification, such as those described with reference to FIGS. 2A-2C.

Similarly, the transmission lines 610, 612, 614, 616, and 618 may be implemented as a microstrip, stripline, coplanar microstrip, suspended microstrip, or other, where the transmission lines 610, 612, 614, 616, and 618 are each implemented as a metallization strip disposed on a dielectric or semiconductor substrate. The resistors R0, R1 and R2 may also be implemented as suitably dimensioned thin film material, such as titanium nitride (TiN), disposed on the dielectric or semiconductor substrate.

Figure 7:
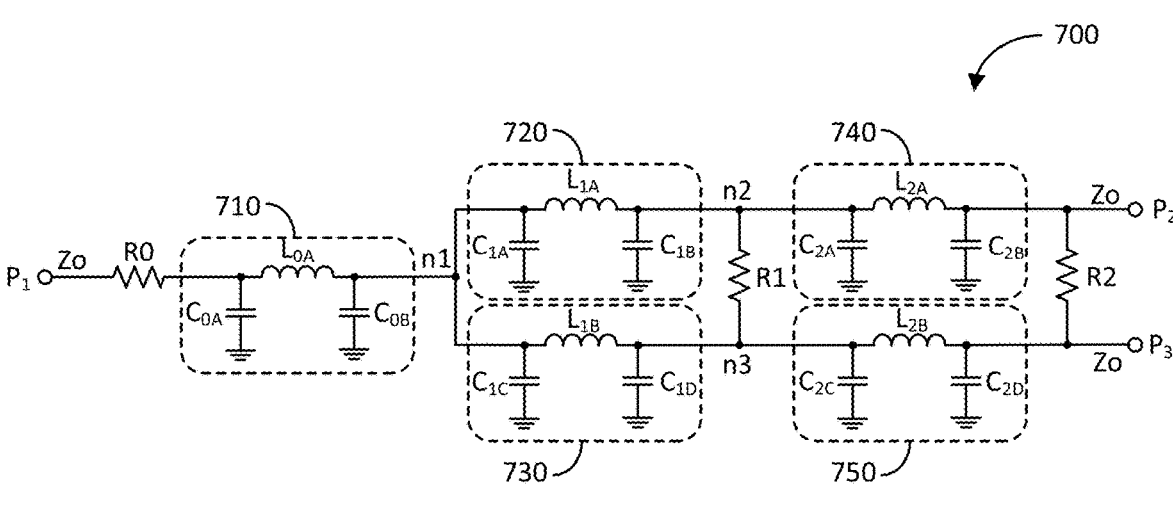
FIG. 7 illustrates a schematic diagram of another example signal power splitter/combiner in accordance with another aspect of the disclosure.

FIG. 7 illustrates a schematic diagram of another example signal power splitter/combiner 700 in accordance with another aspect of the disclosure. The signal power splitter/combiner 700 may be an alternative discrete component implementation of signal power splitter/combiner 600 previously discussed.

The signal power splitter/combiner 700 includes a signal port $P_1$, a loading resistor R0, a series impedance transformer 710, a first parallel impedance transformer 720, a second parallel impedance transformer 730, a first resistor R1, a third parallel impedance transformer 740, a fourth parallel impedance transformer 750, a second resistor R2, a second signal port $P_2$, and a third signal port $P_3$. The loading resistor R0 and the series impedance transformer 710 are coupled in series between the first port $P_1$ and a first intermediate node n1. The series impedance transformer 710 includes a first shunt capacitor $C_{0A}$ coupled between the first port $P_1$ and a lower voltage rail (e.g., ground), a series inductor $L_{0A}$ coupled between the first port $P_1$ and the first intermediate node n1, and a second shunt capacitor $C_{0B}$ coupled between the first intermediate node n1 and the lower voltage rail (e.g., ground).

The first parallel impedance transformer 720 is coupled between the first intermediate node n1 and a second intermediate node n2. The first parallel impedance transformer 720 includes a first shunt capacitor $C_{1A}$ coupled between the first intermediate node n1 and the lower voltage rail (e.g., ground), a series inductor $L_{1A}$ coupled between the first intermediate node n1 and the second intermediate node n2, and a second shunt capacitor $C_{1B}$ coupled between the second intermediate node n2 and the lower voltage rail (e.g., ground).

The second parallel impedance transformer 730 is coupled between the first intermediate node n1 and a third intermediate node n3. The second parallel impedance transformer 730 includes a first shunt capacitor $C_{1C}$ coupled between the first intermediate node n1 and the lower voltage rail (e.g., ground), a series inductor $L_{1B}$ coupled between the first intermediate node n1 and the third intermediate node n3, and a second shunt capacitor $C_{1D}$ coupled between the third intermediate node n3 and the lower voltage rail (e.g., ground). The first resistor R1 is coupled between the second and third intermediate nodes n2 and n3.

The third parallel impedance transformer 740 is coupled between the second intermediate node n2 and the second port $P_2$. The third parallel impedance transformer 740 includes a first shunt capacitor $C_{2A}$ coupled between the second intermediate node n2 and the lower voltage rail (e.g., ground), a series inductor $L_{2A}$ coupled between the second intermediate node n2 and the second port $P_2$, and a second shunt capacitor $C_{2B}$ coupled between the second port $P_2$ and the lower voltage rail (e.g., ground).

The fourth parallel impedance transformer 750 is coupled between the third intermediate node n3 and the third port $P_3$. The fourth impedance transformer 750 includes a first shunt capacitor $C_{2C}$ coupled between the third intermediate node n3 and the lower voltage rail (e.g., ground), a series inductor $L_{2B}$ coupled between the third intermediate node n3 and the third port $P_3$, and a second shunt capacitor $C_{2D}$ coupled between the third port $P_3$ and the lower voltage rail (e.g., ground).

If the signal power splitter/combiner 700 is used as a power splitter, the signal power splitter/combiner 700 receives an input signal $P_{in}$ at port $P_1$, and generates output signals $P_{out1}$ and $P_{out2}$ at the ports $P_2$ and $P_3$, respectively. If the signal power splitter/combiner 700 is used as a power combiner, the signal power splitter/combiner 700 receives input signals $P_{in1}$ and $P_{in2}$ at ports $P_2$ and $P_3$, respectively, and generates an output signal $P_{out}$ at the port $P_1$.

If the ports $P_1$, $P_2$, and $P_3$ each have a characteristic impedance Zo at a particular wavelength λ or frequency, the loading resistor R0 and the series impedance transformer 710 may be configured to improve the return loss (and/or other characteristic(s)) of the signal power splitter/combiner 700 at one or more desired frequency bands, such as the lower frequency band (e.g., 0-1 GHz) and a portion of an upper frequency band (e.g., 7-15 GHz) previously discussed. This may be accomplished by setting the resistance of the loading resistor R0, and the capacitance and inductance of capacitors $C_{0A}$ and $C_{0B}$ and inductor $L_{0A}$ of the series impedance transformer 710, respectively.

Similar to signal power splitter/combiner 600, the first and second parallel impedance transformers 720 and 730 may be configured to perform substantially the same impedance transformation as the first and second parallel transmission lines 612 and 614, respectively. This may be accomplished by setting the capacitance and inductance of capacitors $C_{1A}$, $C_{1B}$, $C_{1C}$, and $C_{1D}$ and inductors $L_{1A}$ and $L_{1B}$, respectively. Similarly, the third and fourth parallel impedance transformers 740 and 750 may be configured to perform substantially the same impedance transformation as the third and fourth parallel transmission lines 616 and 618, respectively. This may be accomplished by setting the capacitance and inductance of capacitors $C_{2A}$, $C_{2B}$, $C_{2C}$, and $C_{2D}$ and inductors $L_{2A}$ and $L_{2B}$, respectively. The resistors R1 and R2 of power splitter/combiner 700 may be implemented to have substantially the same resistances as resistors R1 and R2 of power splitter/combiner 600, respectively.

Figure 8:
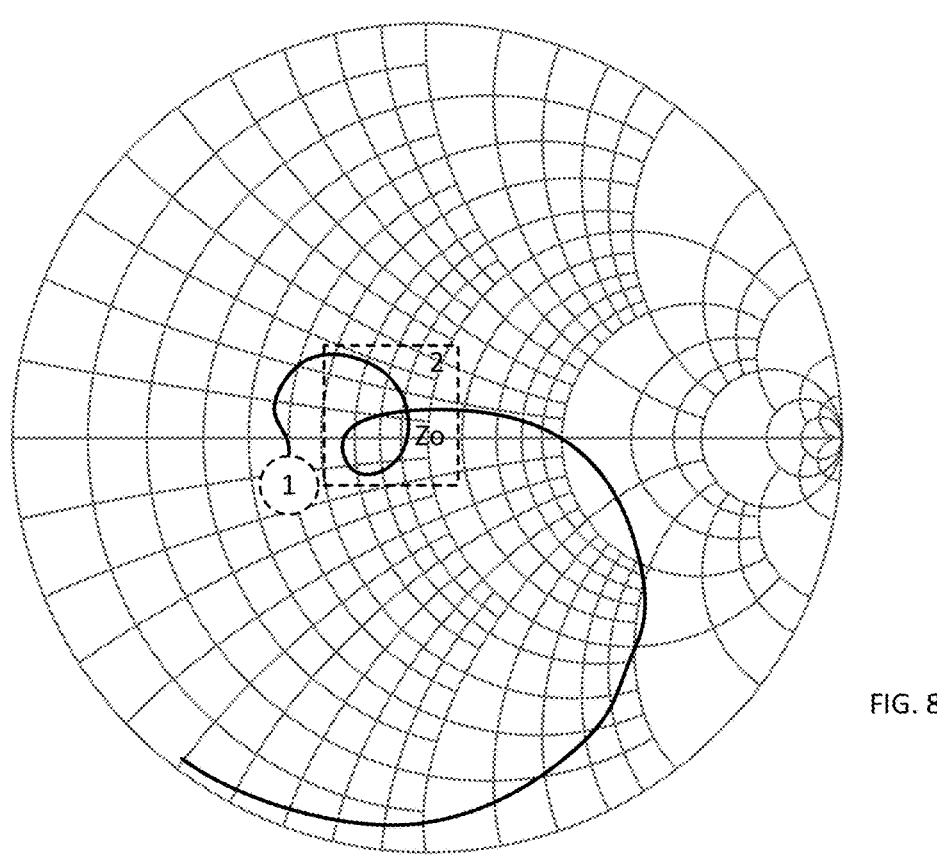
FIG. 8 illustrates an example Smith chart of an impedance at a signal port of the signal power splitter/combiner of FIG. 3 or 4 in accordance with another aspect of the disclosure.

FIG. 8 illustrates an example Smith chart of an impedance at a port of the signal power splitter/combiner 300 or 400 in accordance with another aspect of the disclosure. At low frequencies, such as within the lower frequency band (e.g., 0-1 GHz), the impedance transformers 312, 314, 316, and 318 or 420, 430, 440, and 450 do not substantially affect the low frequency signal. This is because at low frequencies the transmission lines 312, 314, 316, and 318 essentially function as shorts. Similarly, at low frequencies, the capacitors of impedance transformers 420, 430, 440, and 450 essentially function as opens, and the inductors essentially function as shorts.

Thus, from the viewpoint of port $P_1$, the impedance of the signal power splitter/combiner 300 or 400 is essentially R1 in parallel with R2. If, for example, R1 is 1.87·Zo and R2 is 3.11·Zo, then the impedance presented to port $P_1$ by the power splitter/combiner 300 is 0.7·Zo, considering also Zo being present at ports $P_2$ and $P_3$. Thus, as indicated in the Smith Chart, the impedance at such low frequencies is substantially resistive with a resistance less than Zo, as represented by the encircled number "1" on the Smith chart. This is the cause of the poor return loss at low frequencies. The region indicated within the square labeled number "2" is the impedance presented to port $P_1$ by the power splitter/ combiner 300 at higher frequencies, such as the upper frequency band (e.g., 7-15 GHz), where the return loss is better but may not meet the specification for the entire upper frequency band, as previously discussed.

Figure 9:
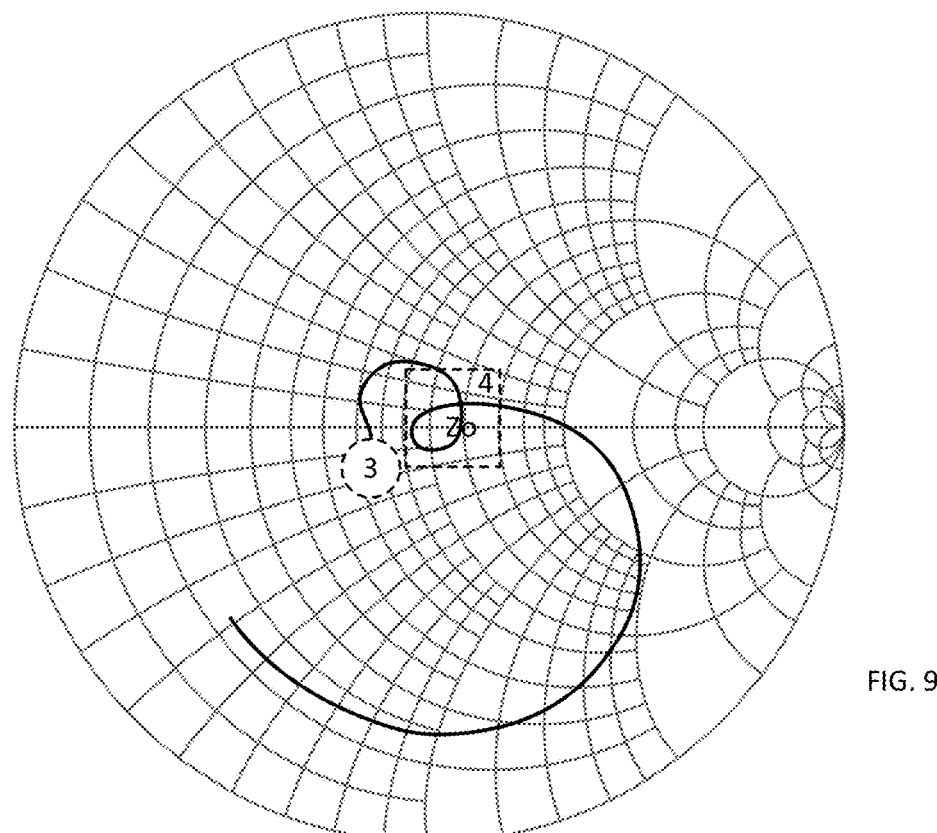
FIG. 9 illustrates an example Smith chart of an impedance at a signal port of the signal power splitter/combiner of FIG. 6 or 7 in accordance with another aspect of the disclosure.

FIG. 9 illustrates an example Smith chart of an impedance at a port of the signal power splitter/combiner 600 or 700 in accordance with another aspect of the disclosure. The addition of the loading resistor R0 in the power splitter/combiner 600 or 700 has the effect of increasing the resistance presented to port $P_1$ by the power splitter/combiner 600 or 700. Thus, the region indicated by the encircled number "3", representing the low frequency impedance, is closer to Zo than the encircled number "1" region of the Smith chart associated with power splitter/combiner 300 or 400. Thus, the addition of the series loading resistor R0 improves the impedance matching or the return loss within the lower frequency band.

The addition of the series loading resistor R0 not only improves the impedance matching or return loss at lower frequencies, but may adversely affect the impedance matching within the upper frequency band. Thus, to compensate for any adverse effect to the impedance matching or return loss within the upper frequency band by the addition of the loading resistor R0, the series impedance transformer 610 or 710 improves the impedance matching or return loss within the upper frequency band. The Smith chart illustrates this with the square region labeled number "4" being compressed around Zo compared to the region "2" of the Smith chart pertaining to the power splitter/combiner 300 or 400. Thus, the addition of the series impedance transformer 610 or 710 improves the impedance matching or the return loss within the upper frequency band.

Figure 10A:
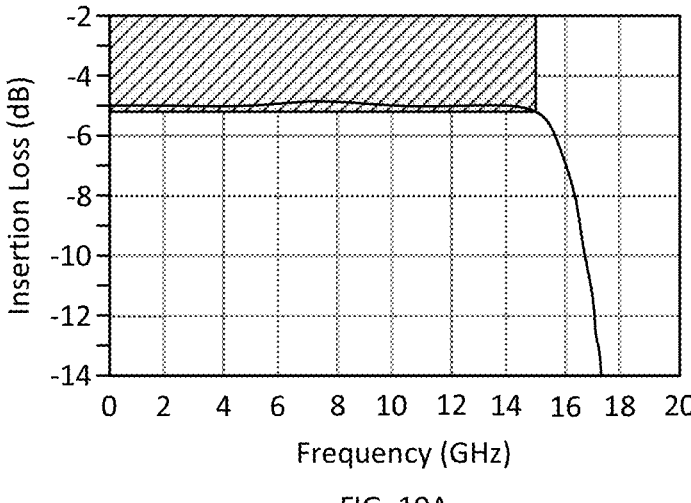
FIGS. 10A-10C illustrate graphs of example specifications and responses associated with the signal power splitter/combiner of FIG. 6 or 7 in accordance with another aspect of the disclosure.
Figure 10B:
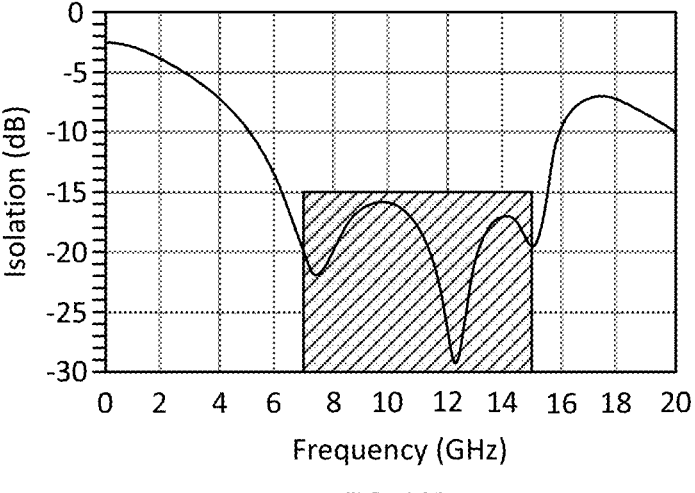
Figure 10C:
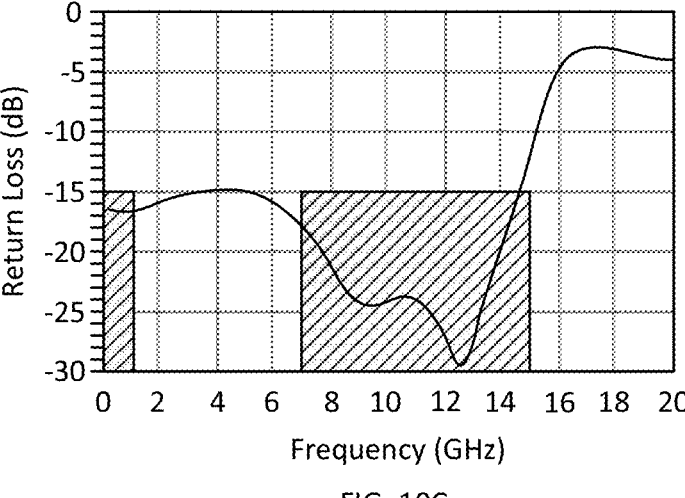

FIGS. 10A-10C illustrate graphs of example specifications and responses associated with the signal power splitter/ combiner 600 or 700 in accordance with another aspect of the disclosure. The dimensions, units, and scales of the graphs are the same as those depicted in FIGS. 2A-2C, previously discussed. The graphs also depict the same specification shaded regions for the insertion loss, isolation, and return loss, respectively.

With regard to insertion loss as depicted in FIG. 10A, the graph shows that the insertion loss in dB between port $P_1$ and port $P_2$ (or $P_1$ and $P_3$) is about 1 dB greater than the corresponding insertion loss of power splitter/combiner 300 or 400, but still less than the −5 dB specification between frequencies 0 to 15 GHz. Thus, the addition of the loading resistor R0 and the series impedance transformer 610 or 710 has minor effects on the insertion loss.

With regard to isolation as depicted in FIG. 10B, the graph shows that the isolation between ports $P_2$ and $P_3$ is greater than −15 dB between frequencies 7 to 15 GHz, which meets the specification. Thus, the addition of the loading resistor R0 and the series impedance transformer 610 or 710 to the two-stage signal power splitter/combiner 300 or 400 does not significantly impact the isolation within the upper frequency band (e.g., 7-15 GHz).

With regard to return loss as depicted in FIG. 10C, the graph shows that the addition of the loading resistor R0 and the series impedance transformer 610 or 710 significantly improves the impedance match or return loss within the lower and the upper frequency bands (e.g., 0-1 GHz and 7-15 GHz). Thus, the return loss within both bands meets the specification of less than −15 dB.

Figures 11, 12:
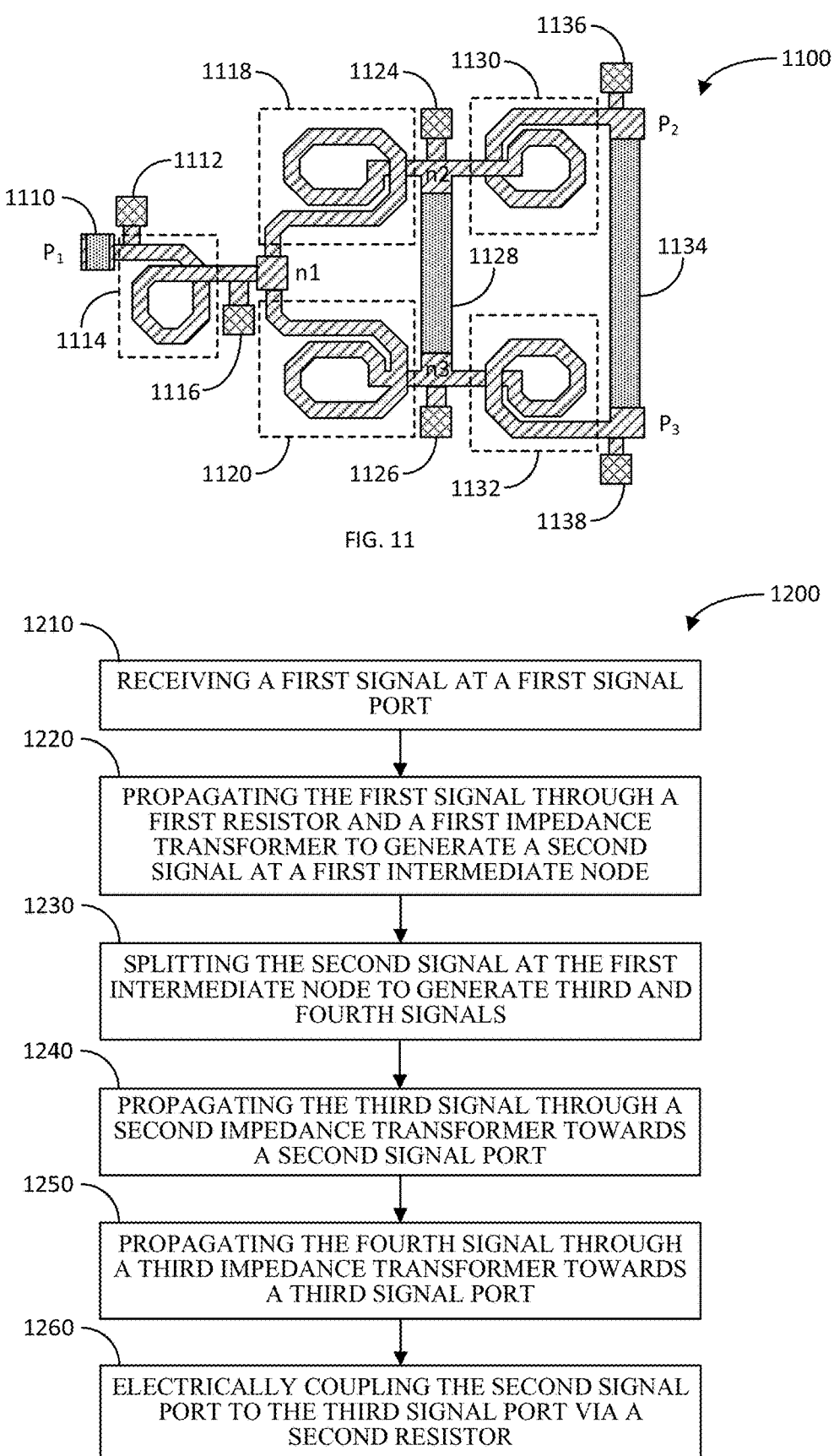
FIG. 11 illustrates a layout diagram of an example signal power splitter/combiner in accordance with another aspect of the disclosure.
FIG. 12 illustrates a flow diagram of an example method of power splitting a signal in accordance with another aspect of the disclosure.

FIG. 11 illustrates a layout diagram of an example signal power splitter/combiner 1100 in accordance with another aspect of the disclosure. The signal power splitter/combiner 1100 is an example layout implementation of the signal power splitter/combiner 700.

The signal power splitter/combiner 1100 includes a signal port $P_1$, a loading resistor 1110, and a series impedance transformer including first and second shunt capacitors 1112 and series inductor 1114. The signal power splitter/combiner 1100 further includes a first parallel impedance transformer including shunt capacitors 1116 and 1124 and series inductor 1118. Note that the shunt capacitor 1116 is shared among the series impedance transformer and the first parallel impedance transformer. Similarly, the signal power splitter/combiner 1100 further includes a second parallel impedance transformer including shunt capacitors 1116 and 1126 and series inductor 1120. Also note that the shunt capacitor 1116 is shared among the series impedance transformer and the second parallel impedance transformer.

The signal power splitter/combiner 1100 further includes a third parallel impedance transformer including shunt capacitors 1124 and 1136, and series inductor 1130. Note that the shunt capacitor 1124 is shared among the first and third parallel impedance transformers. Additionally, the signal power splitter/combiner 1100 further includes a fourth parallel impedance transformer including shunt capacitors 1126 and 1138, and series inductor 1132. Note that the shunt capacitor 1126 is shared among the second and fourth parallel impedance transformers. The signal power splitter/combiner 1100 further includes first and second resistors 1128 and 1134, and second and third signal ports $P_2$ and $P_3$.

The loading resistor 1110 and the series impedance transformer 1112/1114/1116 is coupled in series between the first port $P_1$ and a first intermediate node n 1. The first parallel impedance transformer 1116/1118/1124 is coupled between the first intermediate node n1 and a second intermediate node n2. The second parallel impedance transformer 1116/1120/1126 is coupled between the first intermediate node n1 and a third intermediate node n3. The first resistor 1128 is coupled between the second and third intermediate nodes n2 and n3.

The third parallel impedance transformer 1124/1130/1136 is coupled between the second intermediate node n2 and the second port $P_2$. The fourth parallel impedance transformer 1126/1132/1138 is coupled between the third intermediate node n3 and the third port $P_3$. The second resistor 1134 is coupled between the second and third ports $P_2$ and $P_3$.

As previously mentioned, the resistors 1110, 1128, and 1134 may be implemented as properly dimensioned sheets of resistive material, such as TiN. The capacitors 1112, 1116, 1124, 1126, 1136, and 1138 may be implemented as metal-insulator-metal (MIM) capacitors. The inductors 1114, 1118, 1120, 1130, and 1132 may be implemented as metallization coiled strip formed on one or more metallization layers.

If the signal power splitter/combiner 1100 is used as a power splitter, the signal power splitter/combiner 1100 receives an input signal $P_{in}$ at port $P_1$, and generates output signals $P_{out1}$ and $P_{out2}$ at the ports $P_2$ and $P_3$, respectively. If the signal power splitter/combiner 1100 is used as a power combiner, the signal power splitter/combiner 1100 receives input signals $P_{in1}$ and $P_{in2}$ at ports $P_2$ and $P_3$, respectively, and generates an output signal $P_{out}$ at the port $P_1$.

FIG. 12 illustrates a flow diagram of an example method 1200 of power splitting a signal in accordance with another aspect of the disclosure. The method 1200 includes receiving a first signal at a first signal port (block 1210). Examples of means for receiving a first signal at a first signal port include any of the signal ports $P_1$, $P_{11}$, $P_{21A}$, and $P_{21B}$ described herein.

The method 1200 further includes propagating the first signal through a first resistor and a first impedance transformer to generate a second signal at a first intermediate node (block 1220). Examples of means for propagating the first signal through a first resistor and a first transformer to generate a second signal at a first intermediate node include any of the loading resistors R0 and 1110 and series impedance transformers 610, 710, and 1112/1114/1116 described herein.

The method 1200 also includes splitting the second signal at the first intermediate node to generate third and fourth signals (block 1230). Examples of means for splitting the second signal at the first intermediate node to generate third and fourth signals include any of the intermediate nodes n1 described herein.

The method 1200 additionally includes propagating the third signal through a second impedance transformer towards a second signal port (block 1240). Examples of means for propagating the third signal through a second impedance transformer towards a second signal port include any of the impedance transformers 612, 720, and 1116/1118/1124 described herein.

Further, the method 1200 includes propagating the fourth signal through a third impedance transformer towards a third signal port (block 1250). Examples of means for propagating the fourth signal through a third impedance transformer towards a third signal port include any of the impedance transformers 614, 730, and 1116/1120/1126 described herein.

Also, the method 1200 includes electrically coupling the second signal port to the third signal port via a second resistor (block 1260). Examples of means for electrically coupling the second signal port to the third signal port via a second resistor include the coupling of the second resistor R2 or 1134 between the second and third ports $P_2$ and $P_3$.

The method 1200 may further include propagating the third signal through a fourth impedance transformer from a second intermediate node to the second signal port, wherein the second impedance transformer is coupled between the first and second intermediate nodes, propagating the fourth signal through a fifth impedance transformer from a third intermediate node to the third signal port, wherein the third impedance transformer is coupled between the first and third intermediate nodes; and electrically coupling the second intermediate node to the third intermediate node via a third resistor.

Examples of means for propagating the third signal through a fourth impedance transformer from a second intermediate node to the second signal port include any of the impedance transformers 616, 740, and 1124/1130/1136 described herein. Examples of means for propagating the fourth signal through a fifth impedance transformer from a third intermediate node to the third signal port include any of the impedance transformers 618, 750, and 1126/1132/1138 described herein. Examples of means for electrically coupling the second intermediate node to the third intermediate node via a third resistor include the coupling of the first resistor R1 or 1128 between the second and the third intermediate nodes n2 and n3.

Additionally, the method 1200 may include splitting the third signal at the second signal port to generate fifth and sixth signals. Examples of means for splitting the third signal at the second signal port to generate fifth and sixth signals include any of the power splitters 1520 and 1530 described herein. In addition, the method 1200 may include splitting a fifth signal at the first signal port to generate the first signal and a sixth signal. Examples of means for splitting a fifth signal at the first signal port to generate the first signal and a sixth signal include any of the power splitters 1520 and 1530 as described herein.

FIG. 13 illustrates a flow diagram of an example method 1300 of power combining signals in accordance with another aspect of the disclosure. The method 1300 includes receiving a first signal at a first signal port (block 1310). Examples of means for receiving a first signal at a first signal port include any of the signal ports $P_2$ described herein. The method 1300 further includes receiving a second signal at a second signal port (block 1320). Examples of means for receiving a second signal at a second signal port include any of the signal ports $P_3$ described herein.

Additionally, the method 1300 includes electrically coupling the first signal port to the second signal port via a first resistor (block 1330). Examples of means for electrically coupling the first signal port to the second signal port via a first resistor include the coupling of the second resistor R2 or 1134 between the second and third ports P₂ and P₃ described herein.

The method 1300 also includes propagating the first signal from the first signal port to a first intermediate node via a first impedance transformer (block 1340). Examples of means for propagating the first signal from the first signal port to a first intermediate node via a first impedance transformer include any of the impedance transformers 612, 720, and 1124/1118/1116 described herein.

Further, the method 1300 includes propagating the second signal from the second signal port to the first intermediate node via a second impedance transformer (block 1350). Examples of means for propagating the second signal from the second signal port to the first intermediate node via a second impedance transformer include any of the impedance transformers 614, 730, and 1126/1120/1116 described herein.

The method 1300 also includes combining the first and second signals at the first intermediate node to generate a third signal (block 1360). Examples of means for combining the first and second signals at the first intermediate node to generate a third signal include any of the intermediate nodes n1 described herein.

And the method 1300 includes propagating the third signal from the first intermediate node to a third signal port via a third impedance transformer and a second resistor (block 1370). Examples of means for propagating the third signal from the first intermediate node to a third signal port via a third impedance transformer and a second resistor include any of the series impedance transformers 610, 710, and 1116/1114/1112, and loading resistors R0 and 1110 described herein.

The method 1300 may further include propagating the third signal from the second signal port to a second intermediate node via a fourth impedance transformer, wherein the first impedance transformer is coupled between the first and second intermediate nodes; propagating the fourth signal from the third signal port to a third intermediate node via a fifth impedance transformer, wherein the second impedance transformer is coupled between the first and third intermediate nodes; and electrically coupling the second intermediate node to the third intermediate node via a third resistor.

Examples of means for propagating the third signal from the second signal port to a second intermediate node via a fourth impedance transformer include any of the impedance transformers 616, 740, and 1136/1130/1124 described herein. Examples of propagating the fourth signal from the third signal port to a third intermediate node via a fifth impedance transformer include any of the impedance transformers 618, 750, and 1138/1132/1126 described herein. And examples of means for electrically coupling the second intermediate node to the third intermediate node via a third resistor include the coupling of the first resistor R1 or 1128 between the second and the third intermediate nodes n2 and n3.

Additionally, the method 1300 may include combining the third signal with a fourth signal at the third signal port to generate a fifth signal. Means for combining the third signal with a fourth signal at the third signal port to generate a fifth signal include any of the power splitters 1520 and 1530 as described herein. In addition, the method 1300 may include combining fourth and fifth signals at the first signal port to generate the first signal. Examples of means for combining fourth and fifth signals at the first signal port to generate the first signal include any of the power splitters 1520 and 1530 as further described herein.

Figure 14:
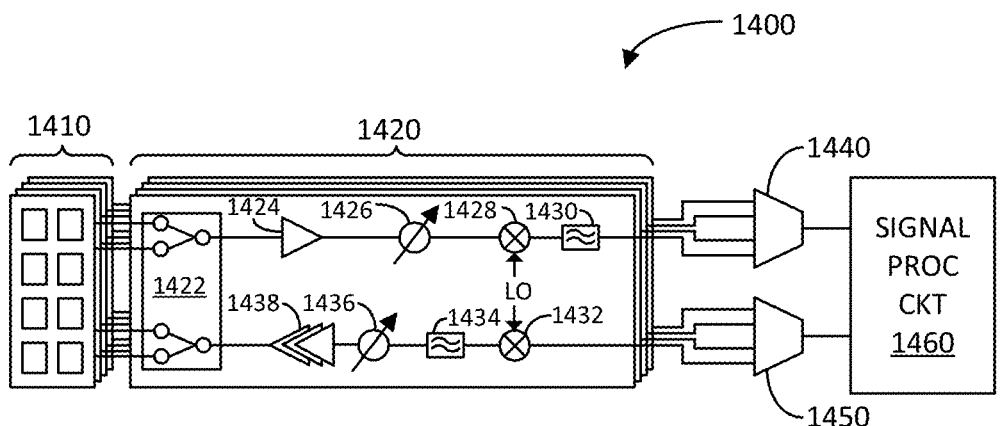
FIG. 14 illustrates a block diagram of an example wireless communication device in accordance with another aspect of the disclosure.

FIG. 14 illustrates a block diagram of an example wireless communication device 1400 in accordance with another aspect of the disclosure. The wireless communication device 1400 may be implemented as a smart phone, tablet device, laptop computer, desktop computer, wearable devices (e.g., a smart watch, activity monitoring device, health monitoring device, etc.), Internet of Things (IoT) device, and others.

The wireless communication device 1400 includes at least one antenna 1410 (e.g., a set of antennas, or one or more phase arrays antennas, etc.), a set of transceiver chains 1420, a signal power combiner 1440, a signal power splitter 1450, and a signal processing circuit 1460. Each of the set of transceiver chains 1420 may include a signal routing circuit 1422 configured to route signals to and from the at least one antenna 1410, a low noise amplifier (LNA) 1424, a phase shifter 1426, a down converting mixer 1428 (which receives a local oscillator (LO) signal), and an intermediate frequency (IF) or baseband (BB) filter 1430. These devices are collectively configured to convert an RF signal received via the at least one antenna 1410 to a received IF or BB signal.

The signal power combiner 1440 includes inputs coupled to outputs of the set of transceivers chains 1420, respectively. For example, the inputs of the signal power combiner 1140 may be coupled to outputs of the corresponding received IF or BB filters 1430 of the set of transceivers chains 1420, respectively. The inputs of the signal power combiner 1140 are configured to receive IF or BB signals from the set of transceivers chains 1420. Considering the previous examples, one of the set of transceivers chains 1420 may be configured to generate an IF signal within the upper frequency band (e.g., 7-15 GHz), and another one of the set of transceivers chains 1420 may be configured to generate an IF signal within the lower frequency band (e.g., 0-1 GHz).

The signal power combiner 1440 is configured to combine the received IF or BB signals to generate a combined received IF or BB signal at its output. The signal power combiner 1440 may be implemented per any of the signal power combiners described herein. The output of the signal power combiner 1440 is coupled to an input of the signal processing circuit 1460. The signal processing circuit 1460 is configured to process the combined received IF or BB signal to recover data therefrom.

The signal processing circuit 1460 is configured to generate a combined transmit IF or BB signal including data. The signal processing circuit 1460 includes an output, at which the combined transmit IF or BB signal is generated, coupled to an input of the signal power splitter 1450. The signal power splitter 1450 is configured to power split the combined transmit IF or BB signal to generate a set of transmit IF or BB signals. The signal power splitter 1450 may be implemented per any of the signal power splitters described herein. The signal power splitter 1450 includes a set of outputs, at which the set of transmit IF or BB signals are generated, coupled to inputs of the set of transceivers chains 1420, respectively.

Each of the set of transceiver chains 1420 may further include an up converting mixer 1432 (which receives the LO signal), a radio frequency (RF) filter 1434, a phase shifter 1436, and a set of one or more amplifiers 1438 (e.g., a pre-amplifier, a power amplifier (PA), etc.). These devices are collectively configured to convert a transmit IF or BB signal received from the signal power splitter 1450 to generate a transmit RF signal, which is provided to the at least one antenna 1410 via the signal routing circuit 1422 for wireless transmission. The set of transmit IF or BB signals generated by the signal power splitter 1450 is provided to the corresponding up converting mixers 1432 of the set of transceivers chains 1420, respectively.

Figure 15:
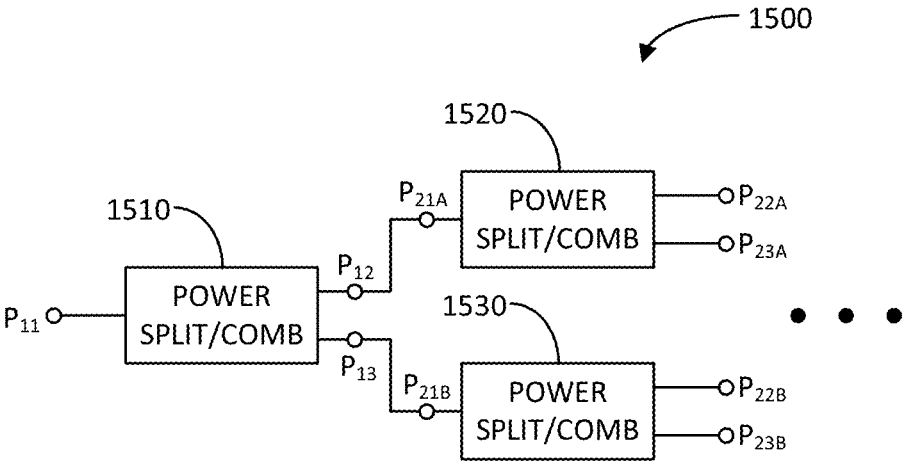
FIG. 15 illustrates a block diagram of another example signal power splitter/combiner in accordance with another aspect of the disclosure.

FIG. 15 illustrates a block diagram of another example signal power splitter/combiner 1500 in accordance with another aspect of the disclosure. The power splitter/combiner 1500 may include a set of hierarchical signal power splitter/combiners, wherein each power splitter/combiner may be configured per any of the signal power splitter/combiner previously discussed.

In particular, the signal power splitter/combiner 1500 includes a first hierarchical-level signal power splitter/combiner 1510 including signal ports $P_{11}$, $P_{12}$, and $P_{13}$. The first hierarchical-level signal power splitter/combiner 1510 may be implemented per any of signal power splitter/combiners 600, 700, and 1100 previously discussed, wherein signal ports $P_{11}$, $P_{12}$, and $P_{13}$ correspond to signal ports $P_1$, $P_2$, and $P_3$ of signal power splitter/combiners 600, 700, and 1100, respectively.

The signal power splitter/combiner 1500 includes a first, second hierarchical-level signal power splitter/combiner 1520 including signal ports $P_{21A}$, $P_{22A}$, and $P_{23A}$. The first, second hierarchical-level signal power splitter/combiner 1520 may be implemented per any of signal power splitter/combiners 600, 700, and 1100 previously discussed, wherein signal ports $P_{21A}$, $P_{22A}$, and $P_{23A}$ correspond to signal ports $P_1$, $P_2$, and $P_3$ of signal power splitter/combiners 600, 700, and 1100, respectively.

The signal power splitter/combiner 1500 includes a second, second hierarchical-level signal power splitter/combiner 1530 including signal ports $P_{21B}$, $P_{22B}$, and $P_{23B}$. The second, second hierarchical-level signal power splitter/combiner 1530 may be implemented per any of signal power splitter/combiners 600, 700, and 1100 previously discussed, wherein signal ports $P_{21B}$, $P_{22B}$, and $P_{23B}$ correspond to signal ports $P_1$, $P_2$, and $P_3$ of signal power splitter/combiners 600, 700, and 1100, respectively.

If the signal power splitter/combiner 1500 is used as a power splitter, the signal power splitter 1500 receives an input signal $P_{in}$ at port $P_{11}$, and the first hierarchical-level splitter 1510 power splits the input signal $P_{in}$ to generate first hierarchical-level output signals $P_{out11}$ and $P_{out12}$ at the ports $P_{12}$ and $P_{13}$, respectively. The first, second hierarchical-level signal power splitter 1520 receives the first hierarchical-level output signal $P_{out11}$ at port $P_{21A}$, and power splits the signal $P_{out11}$ to generate second hierarchical-level output signals $P_{out21}$ and $P_{out22}$ at the ports $P_{22A}$ and $P_{23B}$, respectively. The second, second hierarchical-level signal power splitter 1530 receives the second hierarchical-level output signal $P_{out12}$ at port $P_{21B}$, and power splits the signal $P_{out12}$ to generate second hierarchical-level output signals $P_{out23}$ and $P_{out24}$ at the ports $P_{22B}$ and $P_{23B}$, respectively. It shall be understood that there may be more than two hierarchical levels of signal power splitters.

If the signal power splitter/combiner 1500 is used as a power combiner, the signal power splitter 1500 receives input signals $P_{in1}$, $P_{in2}$, $P_{in3}$, and $P_{in4}$ at ports $P_{22A}$, $P_{23A}$, $P_{22B}$, and $P_{23B}$, respectively. The first, second hierarchical-level signal power combiner 1520 power combines the input signals $P_{in1}$ and $P_{in2}$ to generate a first, first hierarchical-level input signal $P_{in11}$ at port $P_{21A}$. Similarly, the second, second hierarchical-level signal power combiner 1530 power combines the input signals $P_{in3}$ and $P_{in4}$ to generate a second, first hierarchical level input signal $P_{in12}$ at port $P_{21B}$ The first hierarchical-level signal power combiner 1510 receives the first hierarchical-level input signals $P_{in11}$ and $P_{in12}$ at ports $P_{12}$ and $P_{13}$, respectively, and power combines the signals $P_{in11}$ and $P_{in12}$ to generate output signal $P_{out}$ at port $P_{11}$. It shall be understood that there may be more than two hierarchical levels of signal power combiners.

The example shown in FIG. 15 is a 1:4 power splitter or 4:1 power combiner. The maximum signal power splitting or combining is 2n, where n is the number of hierarchical levels. For instance, in this example, n=2. Thus, the maximum number of signal splitting or combining is $2^2$ or 4. An odd number or an even number other than the maximum $2^n$ of signal splitting or combining may be achieved by eliminating one or more power splitter/combiners at the highest hierarchical level. For example, a 1:3 power splitter or 3:1 power combiner may be achieved with power splitter/combiner 1500 by eliminating power splitter/combiner 1530. Another example is a three hierarchical level (n=3), where the highest hierarchical level has 6 power splitter/combiner instead of the maximum 8.

The following provides an overview of aspects of the present disclosure:

Aspect 1: An apparatus, including: a first signal port; a first resistor; a first impedance transformer coupled in series with the first resistor between the first signal port and a first intermediate node; a second impedance transformer coupled between the first intermediate node and a second signal port; a third impedance transformer coupled between the first intermediate node and a third signal port; and a second resistor coupled between the second and third signal ports.

Aspect 2: The apparatus of aspect 1, wherein the first impedance transformer includes a first transmission line with a first impedance and a first length.

Aspect 3: The apparatus of aspect 1 or 2, wherein the second impedance transformer includes a second transmission line with a second impedance and a second length.

Aspect 4: The apparatus of any one of aspects 1-3, wherein the third impedance transformer includes a third transmission line with a third impedance and a third length.

Aspect 5: The apparatus of aspect 4, wherein the second impedance is substantially the same as the third impedance, and wherein the second length is substantially the same as the third length.

Aspect 6: The apparatus of any one of aspects 1-5, wherein the first impedance transformer includes a first shunt capacitor, a first series inductor, and a second shunt capacitor, wherein the first and second shunt capacitors are coupled to both ends of the first series inductor, respectively.

Aspect 7: The apparatus of any one of aspects 1-6, wherein the second impedance transformer includes a third shunt capacitor, a second series inductor, and a fourth shunt capacitor, wherein the third and fourth shunt capacitors are coupled to both ends of the second series inductor, respectively.

Aspect 8: The apparatus of any one of aspects 1-7, wherein the third impedance transformer includes a fifth shunt capacitor, a third series inductor, and a sixth shunt capacitor, wherein the fifth and sixth shunt capacitors are coupled to both ends of the third series inductor, respectively.

Aspect 9: The apparatus of aspect 9, wherein the third, fourth, fifth, and sixth shunt capacitors have substantially the same capacitance, and wherein the second and third series inductors have substantially the same inductance.

Aspect 10: The apparatus of any one of aspects 6-9, wherein the second impedance transformer includes a second series inductor and a third shunt capacitor, wherein the second shunt capacitor is shared among the first and second impedance transformers, and wherein the second and third shunt capacitors are coupled to both ends of the second series inductor, respectively.

Aspect 11: The apparatus of aspect 10, wherein the third impedance transformer includes a third series inductor and a fourth shunt capacitor, wherein the second shunt capacitor is shared among the first, second, and third impedance transformers, and wherein the second and fourth shunt capacitors are coupled to both ends of the third series inductor, respectively.

Aspect 12: The apparatus of any one of aspects 1-11, further including: a fourth impedance transformer coupled between a second intermediate node and the second signal port, wherein the second impedance transformer is coupled between the first intermediate node and the second intermediate node; a fifth impedance transformer coupled between a third intermediate node and the third signal port, wherein the third impedance transformer is coupled between the first intermediate node and the third intermediate node; and a third resistor coupled between the second and third intermediate nodes.

Aspect 13: The apparatus of aspect 12, wherein the fourth impedance transformer includes a first transmission line with a first impedance and a first length, wherein the fifth impedance transformer includes a second transmission line with a second impedance and a second length, wherein the first impedance is substantially the same as the second impedance, and wherein the first length is substantially the same as the second length.

Aspect 14: The apparatus of aspect 12, wherein: the fourth impedance transformer includes a first shunt capacitor, a first series inductor, and a second shunt capacitor, wherein the first and second shunt capacitors are coupled to both ends of the first series inductor, respectively; the fifth impedance transformer includes a third shunt capacitor, a second series inductor, and a fourth shunt capacitor, wherein the third and fourth shunt capacitors are coupled to both ends of the second series inductor, respectively; and the first, second, third, and fourth shunt capacitors have substantially the same capacitance, and wherein the first and second series inductors have substantially the same inductance.

Aspect 15: A method, including: receiving a first signal at a first signal port; propagating the first signal through a first resistor and a first impedance transformer to generate a second signal at a first intermediate node; splitting the second signal at the first intermediate node to generate third and fourth signals; propagating the third signal through a second impedance transformer towards a second signal port; propagating the fourth signal through a third impedance transformer towards a third signal port; and electrically coupling the second signal port to the third signal port via a second resistor.

Aspect 16: The method of aspect 15, wherein the first, second, and third impedance transformers each includes a transmission line.

Aspect 17: The method of aspect 15, wherein the first, second, and third impedance transformers each includes a first shunt capacitor, a series inductor, and a second shunt capacitor, wherein the first and second shunt capacitors are coupled to both ends of the series inductor, respectively.

Aspect 18: The method of any one of aspects 15-17, further including: propagating the third signal through a fourth impedance transformer from a second intermediate node to the second signal port, wherein the second impedance transformer is coupled between the first and second intermediate nodes; propagating the fourth signal through a fifth impedance transformer from a third intermediate node to the third signal port, wherein the third impedance transformer is coupled between the first and third intermediate nodes; and electrically coupling the second intermediate node to the third intermediate node via a third resistor.

Aspect 19: The method of any one of aspects 15-18, further including splitting the third signal at the second signal port to generate fifth and sixth signals.

Aspect 20: The method of any one of aspects 15-19, further splitting a fifth signal to generate the first signal and a sixth signal.

Aspect 21: A method, including: receiving a first signal at a first signal port; receiving a second signal at a second signal port; electrically coupling the first signal port to the second signal port via a first resistor; propagating the first signal from the first signal port to a first intermediate node via a first impedance transformer; propagating the second signal from the second signal port to the first intermediate node via a second impedance transformer; combining the first and second signals at the first intermediate node to generate a third signal; and propagating the third signal from the first intermediate node to a third signal port via a third impedance transformer and a second resistor.

Aspect 22: The method of aspect 21, wherein the first, second, and third impedance transformers each includes a transmission line.

Aspect 23: The method of aspect 21, wherein the first, second, and third impedance transformers each includes a first shunt capacitor, a series inductor, and a second shunt capacitor, wherein the first and second shunt capacitors are coupled to both ends of the series inductor, respectively.

Aspect 24: The method of any one of aspects 21-23, further including: propagating the first signal from the first signal port to a second intermediate node via a fourth impedance transformer, wherein the first impedance transformer is coupled between the first and second intermediate nodes; propagating the second signal from the second signal port to a third intermediate node via a fifth impedance transformer, wherein the second impedance transformer is coupled between the first and third intermediate nodes; and electrically coupling the second intermediate node to the third intermediate node via a third resistor.

Aspect 25: The method of any one of aspects 21-24, further including combining the third signal with a fourth signal to generate a fifth signal.

Aspect 26: The method of any one of aspects 21-25, further including combining fourth and fifth signals to generate the first signal.

Aspect 27: A wireless communication device, including: at least one antenna; a set of transceiver chains coupled to the at least one antenna; and a signal power splitter or combiner coupled to the set of transceiver chains, wherein the signal power splitter or combiner includes: a first signal port; a first resistor; a first impedance transformer coupled in series with the first resistor between the first signal port and a first intermediate node; a second impedance transformer coupled between the first intermediate node and a second signal port; a third impedance transformer coupled between the first intermediate node and a third signal port; and a second resistor coupled between the second and third signal ports.

Aspect 28: The wireless communication device of aspect 27, wherein the first signal port is coupled to an input of a signal processing circuit, and wherein the second and third ports are coupled to inputs of the set of transceiver chains, respectively.

Aspect 29: The wireless communication device of aspect 27, wherein the second and third signal ports are coupled to outputs of the set of transceiver chains, respectively, and wherein the first signal port is coupled to an input of a signal processing circuit.

Aspect 30: The wireless communication device of any one of aspects 27-29, wherein the signal power splitter or combiner further comprises: a fourth impedance transformer coupled between a second intermediate node and the second signal port, wherein the second impedance transformer is coupled between the first intermediate node and the second intermediate node; a fifth impedance transformer coupled between a third intermediate node and the third signal port, wherein the third impedance transformer is coupled between the first intermediate node and the third intermediate node; and a third resistor coupled between the second and third intermediate nodes.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed:

1. An apparatus, comprising:
a signal power splitter;
a first signal port;
a first resistor;
a first impedance transformer coupled in series with the first resistor between the first signal port and a first intermediate node, the first impedance transformer being between the first resistor and the first intermediate node, the first intermediate node coupled to the signal power splitter, wherein the first resistor and the first impedance transformer are configured to improve an impedance match or a return loss of the signal power splitter over a wider bandwidth; and
the signal power splitter, comprising:
a second impedance transformer having an input and an output, the first intermediate node being directly coupled to the input, and the output being coupled to a second signal port via a second intermediate node coupled between the output and the second signal port;
a third impedance transformer having an input and an output, the first intermediate node being directly coupled to the input, and the output being coupled to a third signal port via a third intermediate node coupled between the output and the third signal port; and
a second resistor coupled between the second and third signal ports;
wherein the first signal port is configured to receive a first input signal, and the first intermediate node is situated to split the first input signal to generate first and second output signals at the second and third signal ports, respectively.

2. The apparatus of claim 1, wherein the first impedance transformer comprises a first transmission line with a first impedance and a first length.

3. The apparatus of claim 2, wherein the second impedance transformer comprises a second transmission line with a second impedance and a second length.

4. The apparatus of claim 3, wherein the third impedance transformer comprises a third transmission line with a third impedance and a third length.

5. The apparatus of claim 4, wherein the second impedance is substantially the same as the third impedance, and wherein the second length is substantially the same as the third length.

6. The apparatus of claim 1, wherein the first impedance transformer comprises a first shunt capacitor, a first series inductor, and a second shunt capacitor, wherein the first and second shunt capacitors are coupled to both ends of the first series inductor, respectively.

7. The apparatus of claim 6, wherein the second impedance transformer comprises a third shunt capacitor, a second series inductor, and a fourth shunt capacitor, wherein the third and fourth shunt capacitors are coupled to both ends of the second series inductor, respectively.

8. The apparatus of claim 7, wherein the third impedance transformer comprises a fifth shunt capacitor, a third series inductor, and a sixth shunt capacitor, wherein the fifth and sixth shunt capacitors are coupled to both ends of the third series inductor, respectively.

9. The apparatus of claim 8, wherein the third, fourth, fifth, and sixth shunt capacitors have substantially the same capacitance, and wherein the second and third series inductors have substantially the same inductance.

10. The apparatus of claim 6, wherein the second impedance transformer comprises a second series inductor and a third shunt capacitor, wherein the second shunt capacitor is shared among the first and second impedance transformers, and wherein the second and third shunt capacitors are coupled to both ends of the second series inductor, respectively.

11. The apparatus of claim 10, wherein the third impedance transformer comprises a third series inductor and a fourth shunt capacitor, wherein the second shunt capacitor is shared among the first, second, and third impedance transformers, and wherein the second and fourth shunt capacitors are coupled to both ends of the third series inductor, respectively.

12. The apparatus of claim 1, further comprising:
a fourth impedance transformer having an input and an output, the input being directly coupled to the second intermediate node and the output being directly coupled to the second signal port, wherein the output of the second impedance transformer is directly coupled to the second intermediate node;
a fifth impedance transformer having an input and an output, the input being directly coupled to the third intermediate node and the output being directly coupled to the third signal port, wherein the output of the third impedance transformer is directly coupled to the third intermediate node; and a third resistor coupled between the second and third intermediate nodes.

13. The apparatus of claim 12, wherein the fourth impedance transformer comprises a first transmission line with a first impedance and a first length, wherein the fifth impedance transformer comprises a second transmission line with a second impedance and a second length, wherein the first impedance is substantially the same as the second impedance, and wherein the first length is substantially the same as the second length.

14. The apparatus of claim 12, wherein:

the fourth impedance transformer comprises a first shunt capacitor, a first series inductor, and a second shunt capacitor, wherein the first and second shunt capacitors are coupled to both ends of the first series inductor, respectively;

the fifth impedance transformer comprises a third shunt capacitor, a second series inductor, and a fourth shunt capacitor, wherein the third and fourth shunt capacitors are coupled to both ends of the second series inductor, respectively; and the first, second, third, and fourth shunt capacitors have substantially the same capacitance, and wherein the first and second series inductors have substantially the same inductance.

15. A wireless communication device, comprising:

at least one antenna;

a set of transceiver chains coupled to the at least one antenna; and a signal power splitter coupled to the set of transceiver chains;

a first signal port;

a first resistor;

a first impedance transformer coupled in series with the first resistor between the first signal port and a first intermediate node, the first impedance transformer being between the first resistor and the first intermediate node, the first intermediate node coupled to the signal power splitter, wherein the first resistor and the first impedance transformer are configured to improve an impedance match or a return loss of the signal power splitter does not include any additional signal path coupled to the first signal port; and the signal power splitter comprising:

a second impedance transformer having an input and an output, the first intermediate node being directly coupled to the input, and the output being coupled to a second signal port via a second intermediate node coupled between the output and the second signal port;

a third impedance transformer having an input and an output, the first intermediate node being directly coupled to the input, and the output being coupled to a third signal port via a third intermediate node coupled between the output and the third signal port; and a second resistor coupled between the second and third signal ports;

wherein the first signal port is configured to receive a first input signal, and the first intermediate node is situated to split the first input signal to generate first and second output signals at the second and third signal ports, respectively.

16. The wireless communication device of claim 15, wherein the first signal port is coupled to an input of a signal processing circuit, and wherein the second and third signal ports are coupled to inputs of the set of transceiver chains, respectively.

17. The wireless communication device of claim 15, wherein the second and third signal ports are coupled to outputs of the set of transceiver chains, respectively, and wherein the first signal port is coupled to an input of a signal processing circuit.

18. The wireless communication device of claim 15, wherein the signal power splitter further comprises:

a fourth impedance transformer having an input and an output, the input being directly coupled to the second intermediate node and the output being directly coupled to the second signal port, wherein the output of the second impedance transformer is directly coupled to the second intermediate node;

a fifth impedance transformer having an input and an output, the input being directly coupled to the third intermediate node and the output being directly coupled to the third signal port, wherein the output of the third impedance transformer is directly coupled to the third intermediate node; and a third resistor coupled between the second and third intermediate nodes.

19. The apparatus of claim 1, wherein the first resistor includes a first resistance related to an impedance at the first signal port and a second resistance of the second resistor.

20. The apparatus of claim 12, wherein the first resistor includes a first resistance related to an impedance at the first signal port, a second resistance of the second resistor, and a third resistance of the third resistor.

21. The apparatus of claim 12, wherein the first resistor includes a first resistance related to a parallel resistance of the second and third resistors.

22. The apparatus of claim 12, wherein the first resistor includes a first resistance related to an impedance at the first signal port and a parallel resistance of the second and third resistors.

23. The apparatus of claim 1, wherein the first resistor and the first impedance transformer improve an impedance match between a first impedance at the first signal port and a second impedance at the first intermediate node.

24. The apparatus of claim 1, wherein:

the first resistor improves an impedance match between a first impedance at the first signal port and a second impedance at the first intermediate node at a first region of an operating frequency range of the signal power splitter; and the first impedance transformer improves the impedance match between the first impedance at the first signal port and the second impedance at the first intermediate node at a second region of the operating frequency range of the signal power splitter, the second region being higher in frequency than the first region.

* * * * *